United States Patent
Morris et al.

(10) Patent No.: US 8,835,226 B2
(45) Date of Patent: Sep. 16, 2014

(54) CONNECTION USING CONDUCTIVE VIAS

(75) Inventors: Thomas Scott Morris, Lewisville, NC (US); Ulrik Riis Madsen, Herning (DK); Donald Joseph Leahy, Kernersville, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 186 days.

(21) Appl. No.: 13/034,787

(22) Filed: Feb. 25, 2011
(Under 37 CFR 1.47)

(65) Prior Publication Data

US 2012/0217624 A1   Aug. 30, 2012

(51) Int. Cl.
   *H01L 21/60*   (2006.01)
   *H01L 23/498*   (2006.01)
   *H01L 21/56*   (2006.01)
   *H01L 23/00*   (2006.01)
   *H01L 23/552*   (2006.01)

(52) U.S. Cl.
   CPC ........ *H01L 23/49827* (2013.01); *H01L 21/561* (2013.01); *H01L 24/97* (2013.01); *H01L 23/552* (2013.01)
   USPC ................... 438/124; 257/659; 257/E21.502; 438/121

(58) Field of Classification Search
   USPC ................. 257/659, 660, E23.114, E21.502; 438/121, 124
   See application file for complete search history.

(56) References Cited

U.S. PATENT DOCUMENTS

| | | | |
|---|---|---|---|
| 3,566,190 A | 2/1971 | Huebner et al. | |
| 3,907,616 A | 9/1975 | Wiemer et al. | |
| 3,907,617 A | 9/1975 | Zwernemann | |
| 4,680,676 A | 7/1987 | Petratos et al. | |
| 5,389,738 A | 2/1995 | Piosenka et al. | |
| 5,406,630 A | 4/1995 | Piosenka et al. | |
| 5,436,203 A | 7/1995 | Lin | |
| 5,459,368 A | 10/1995 | Onishi et al. | |
| 5,473,512 A | 12/1995 | Degani et al. | |

(Continued)

FOREIGN PATENT DOCUMENTS

| | | |
|---|---|---|
| CN | 1855451 A | 11/2006 |
| EP | 1764834 B1 | 9/2005 |

(Continued)

OTHER PUBLICATIONS

Final Office Action for U.S. Appl. No. 11/952,513 mailed Oct. 26, 2011, 16 pages.

(Continued)

*Primary Examiner* — Allan R Wilson
(74) *Attorney, Agent, or Firm* — Withrow & Terranova, P.L.L.C.

(57) ABSTRACT

In one embodiment, a meta-module having circuitry for two or more modules is formed on a substrate, which is preferably a laminated substrate. The circuitry for the different modules is initially formed on the single meta-module. Each module will have one or more component areas in which the circuitry is formed. A metallic structure is formed on or in the substrate for each component area to be shielded. A single body, such as an overmold body, is then formed over all of the modules on the meta-module. At least a conductive vertical interconnect access structure (vias) associated with each component area to be shielded is then exposed through the body by a cutting, drilling, or similar operation. Next, an electromagnetic shield material is applied to the exterior surface of the body of each of the component areas to be shielded and in contact with the exposed conductive vias.

12 Claims, 37 Drawing Sheets

(56) References Cited

U.S. PATENT DOCUMENTS

| | | | |
|---|---|---|---|
| 5,639,989 A | 6/1997 | Higgins, III | |
| 5,646,828 A | 7/1997 | Degani et al. | |
| 5,650,659 A | 7/1997 | Mostafazadeh et al. | |
| 5,977,626 A | 11/1999 | Wang et al. | |
| 6,004,180 A | 12/1999 | Knall et al. | |
| 6,011,698 A | 1/2000 | Buehler | |
| 6,137,693 A | 10/2000 | Schwiebert et al. | |
| 6,150,193 A | 11/2000 | Glenn | |
| 6,163,454 A | 12/2000 | Strickler | |
| 6,297,957 B1 | 10/2001 | Johnson et al. | |
| 6,448,583 B1 | 9/2002 | Yoneda et al. | |
| 6,448,793 B1 | 9/2002 | Barratt et al. | |
| 6,466,416 B1 | 10/2002 | Honjo et al. | |
| 6,538,196 B1 | 3/2003 | MacDonald et al. | |
| 6,590,152 B1 | 7/2003 | Horio et al. | |
| 6,599,779 B2 | 7/2003 | Shim et al. | |
| 6,613,660 B2 | 9/2003 | Kahlert et al. | |
| 6,633,073 B2 | 10/2003 | Rezvani | |
| 6,657,592 B2 | 12/2003 | Dening et al. | |
| 6,707,168 B1 | 3/2004 | Hoffman | |
| 6,717,485 B2 | 4/2004 | Kolb et al. | |
| 6,791,795 B2 | 9/2004 | Ohtomo et al. | |
| 6,807,731 B2 | 10/2004 | Brandenburg et al. | |
| 6,825,560 B1 | 11/2004 | Walker | |
| 6,838,750 B2 | 1/2005 | Nuytkens et al. | |
| 6,887,787 B2 | 5/2005 | Farnworth | |
| 6,900,383 B2 | 5/2005 | Babb et al. | |
| 6,946,324 B1 | 9/2005 | McLellan et al. | |
| 6,998,532 B2 | 2/2006 | Kawamoto et al. | |
| 7,030,469 B2 | 4/2006 | Mahadevan et al. | |
| 7,042,398 B2 | 5/2006 | Tang | |
| 7,087,461 B2 | 8/2006 | Park et al. | |
| 7,087,462 B1 | 8/2006 | Park et al. | |
| 7,109,817 B2 | 9/2006 | Kolb | |
| 7,125,744 B2 | 10/2006 | Takehara et al. | |
| 7,148,574 B2 | 12/2006 | Lee et al. | |
| 7,187,060 B2 | 3/2007 | Usui | |
| 7,227,719 B2 | 6/2007 | Sasaki | |
| 7,259,041 B2 | 8/2007 | Stelzl et al. | |
| 7,342,303 B1 | 3/2008 | Berry et al. | |
| 7,348,663 B1 | 3/2008 | Kirloskar et al. | |
| 7,433,203 B1 | 10/2008 | Yi et al. | |
| 7,443,693 B2 | 10/2008 | Arnold et al. | |
| 7,445,968 B2 | 11/2008 | Harrison et al. | |
| 7,451,539 B2 | 11/2008 | Morris et al. | |
| 7,478,474 B2 | 1/2009 | Koga | |
| 7,488,903 B2 | 2/2009 | Kawagishi et al. | |
| 7,514,772 B2 | 4/2009 | Kobayashi et al. | |
| 7,548,430 B1 * | 6/2009 | Huemoeller et al. | 361/760 |
| 7,598,606 B2 | 10/2009 | Chow et al. | |
| 7,633,170 B2 | 12/2009 | Yang et al. | |
| 7,633,765 B1 * | 12/2009 | Scanlan et al. | 361/760 |
| 7,635,918 B2 | 12/2009 | Yoshida | |
| 7,636,245 B2 | 12/2009 | Clancy et al. | |
| 7,643,311 B2 | 1/2010 | Coffy | |
| 7,651,889 B2 | 1/2010 | Tang et al. | |
| 7,665,201 B2 | 2/2010 | Sjoedin | |
| 7,671,451 B2 | 3/2010 | Lee et al. | |
| 7,700,411 B2 | 4/2010 | Yang et al. | |
| 7,701,728 B2 | 4/2010 | Hatanaka et al. | |
| 7,772,046 B2 | 8/2010 | Pagaila et al. | |
| 7,829,981 B2 | 11/2010 | Hsu | |
| 7,902,643 B2 | 3/2011 | Tuttle | |
| 7,928,538 B2 | 4/2011 | Salzman | |
| 8,013,258 B2 | 9/2011 | Wu | |
| 8,061,012 B2 * | 11/2011 | Carey et al. | 29/592 |
| 8,093,690 B2 * | 1/2012 | Ko et al. | 257/660 |
| 8,220,145 B2 * | 7/2012 | Hiner et al. | 29/841 |
| 8,373,264 B2 * | 2/2013 | Welch et al. | 257/692 |
| 8,434,220 B2 | 5/2013 | Rao et al. | |
| 8,614,899 B2 | 12/2013 | Madsen et al. | |
| 2002/0036345 A1 | 3/2002 | Iseki et al. | |
| 2002/0118529 A1 | 8/2002 | Babin | |
| 2003/0011049 A1 | 1/2003 | Nuytkens et al. | |
| 2003/0048581 A1 | 3/2003 | Ohtomo et al. | |
| 2003/0062541 A1 | 4/2003 | Warner | |
| 2003/0151122 A1 | 8/2003 | Davies | |
| 2004/0063246 A1 * | 4/2004 | Karnezos | 438/108 |
| 2004/0103509 A1 | 6/2004 | Bidard | |
| 2004/0104473 A1 | 6/2004 | Farnworth | |
| 2004/0178500 A1 | 9/2004 | Usui | |
| 2004/0209434 A1 | 10/2004 | Seaford et al. | |
| 2004/0214023 A1 | 10/2004 | Park et al. | |
| 2004/0222511 A1 * | 11/2004 | Zhang | 257/686 |
| 2004/0232536 A1 | 11/2004 | Fukuzumi | |
| 2004/0238934 A1 | 12/2004 | Warner et al. | |
| 2005/0046001 A1 | 3/2005 | Warner | |
| 2005/0153061 A1 | 7/2005 | Nuytkens et al. | |
| 2006/0033184 A1 | 2/2006 | Park et al. | |
| 2006/0151203 A1 | 7/2006 | Krueger et al. | |
| 2006/0223577 A1 | 10/2006 | Ouzillou | |
| 2006/0244131 A1 | 11/2006 | Kobayashi et al. | |
| 2006/0273813 A1 * | 12/2006 | Coffy | 324/763 |
| 2006/0274517 A1 | 12/2006 | Coffy | |
| 2007/0030661 A1 | 2/2007 | Morris et al. | |
| 2007/0042593 A1 | 2/2007 | Lee et al. | |
| 2007/0045248 A1 | 3/2007 | Schein et al. | |
| 2007/0058748 A1 | 3/2007 | Kim et al. | |
| 2007/0062637 A1 | 3/2007 | Sjoedin | |
| 2007/0155053 A1 * | 7/2007 | Karnezos | 438/109 |
| 2007/0163802 A1 | 7/2007 | Monthei | |
| 2007/0200210 A1 | 8/2007 | Zhao et al. | |
| 2007/0222697 A1 | 9/2007 | Caimi et al. | |
| 2007/0290322 A1 | 12/2007 | Zhao et al. | |
| 2008/0019112 A1 | 1/2008 | Hatanaka et al. | |
| 2008/0054421 A1 | 3/2008 | Dimaano | |
| 2008/0108179 A1 * | 5/2008 | Mistry et al. | 438/117 |
| 2008/0112151 A1 | 5/2008 | Thompson et al. | |
| 2008/0142938 A1 | 6/2008 | Chow et al. | |
| 2008/0157316 A1 | 7/2008 | Yang | |
| 2008/0210462 A1 | 9/2008 | Kawagishi et al. | |
| 2008/0224306 A1 | 9/2008 | Yang | |
| 2008/0308912 A1 | 12/2008 | Cha et al. | |
| 2008/0317188 A1 | 12/2008 | Staszewski et al. | |
| 2009/0000114 A1 | 1/2009 | Rao et al. | |
| 2009/0000815 A1 | 1/2009 | Hiner et al. | |
| 2009/0000816 A1 | 1/2009 | Hiner et al. | |
| 2009/0002969 A1 | 1/2009 | Madsen et al. | |
| 2009/0002970 A1 | 1/2009 | Leahy et al. | |
| 2009/0002971 A1 | 1/2009 | Carey et al. | |
| 2009/0002972 A1 | 1/2009 | Carey et al. | |
| 2009/0016039 A1 | 1/2009 | Imamura | |
| 2009/0025211 A1 | 1/2009 | Hiner et al. | |
| 2009/0051011 A1 | 2/2009 | Usami | |
| 2009/0066588 A1 | 3/2009 | Cheng et al. | |
| 2009/0072357 A1 | 3/2009 | Tang et al. | |
| 2009/0072364 A1 | 3/2009 | Punzalan et al. | |
| 2009/0079041 A1 | 3/2009 | Huang et al. | |
| 2009/0140402 A1 | 6/2009 | Ohtani | |
| 2009/0227273 A1 | 9/2009 | McCune, Jr. | |
| 2009/0233562 A1 | 9/2009 | Kim et al. | |
| 2009/0270054 A1 | 10/2009 | Ridgers et al. | |
| 2009/0302438 A1 | 12/2009 | Chauhan et al. | |
| 2010/0199492 A1 | 8/2010 | Hiner et al. | |
| 2010/0279730 A1 | 11/2010 | Ortiz | |
| 2011/0014880 A1 | 1/2011 | Nicolson et al. | |
| 2011/0017263 A1 | 1/2011 | Gibson et al. | |
| 2011/0038136 A1 | 2/2011 | Carey et al. | |
| 2011/0225803 A1 | 9/2011 | Hiner et al. | |
| 2011/0235282 A1 | 9/2011 | Leahy et al. | |
| 2011/0298109 A1 * | 12/2011 | Pagaila et al. | 257/660 |
| 2011/0298670 A1 | 12/2011 | Jung et al. | |
| 2012/0074538 A1 * | 3/2012 | Tsai et al. | 257/659 |
| 2012/0270371 A1 * | 10/2012 | DeBar et al. | 438/127 |

FOREIGN PATENT DOCUMENTS

| | | |
|---|---|---|
| EP | 1715520 A1 | 10/2006 |
| EP | 1717857 A2 | 11/2006 |
| JP | 11-163583 | 6/1999 |
| JP | 2004207352 A | 7/2004 |
| JP | 2005039007 A | 2/2005 |
| JP | 2005109306 A | 4/2005 |
| JP | 2006310629 A | 11/2006 |

(56) References Cited

FOREIGN PATENT DOCUMENTS

| JP | 2006332255 A | 12/2006 |
| JP | 2007311396 A | 11/2007 |
| KR | 20060113412 A | 11/2006 |
| WO | 0035085 A1 | 6/2000 |
| WO | 03058812 A1 | 7/2003 |
| WO | 2004019490 A1 | 3/2004 |
| WO | 2004060034 A1 | 7/2004 |
| WO | 2007060784 A1 | 5/2007 |
| WO | 2007132560 A1 | 11/2007 |
| WO | 2009144960 A1 | 12/2009 |
| WO | 2010021262 A1 | 2/2010 |

OTHER PUBLICATIONS

Non-final Office Action for U.S. Appl. No. 13/117,284 mailed Nov. 9, 2011, 12 pages.
Non-final Office Action for U.S. Appl. No. 11/952,592 mailed Sep. 19, 2011, 9 pages.
Non-final Office Action for U.S. Appl. No. 11/952,617 mailed Jul. 28, 2011, 9 pages.
Final Office Action for U.S. Appl. No. 11/952,634 mailed Feb. 1, 2011, 7 pages.
Notice of Allowance for U.S. Appl. No. 11/952,670 mailed Oct. 21, 2009, 24 pages.
Office Action for Chinese patent application 200880104171.1 mailed Jun. 2, 2011, 20 pages.
Non-final Office Action for U.S. Appl. No. 11/952,484 mailed Oct. 27, 2011, 22 pages.
Final Office Action for U.S. Appl. No. 11/952,592 mailed Jan. 18, 2012, 10 pages.
Non-Final Rejection for U.S. Appl. No. 12/913,364 mailed Feb. 13, 2012, 32 pages.
Final Rejection for U.S. Appl. No. 11/952,617 mailed Feb. 16, 2012, 15 pages.
Notice of Allowance for U.S. Appl. No. 11/952,513 mailed Mar. 6, 2012, 16 pages.
Second Office Action for Chinese patent application 200880104171.1 mailed Feb. 16, 2012, 14 pages.
Final Office Action for U.S. Appl. No. 13/117,284 mailed Feb. 29, 2012, 8 pages.
Notice of Allowance for U.S. Appl. No. 13/117,284 mailed May 1, 2012, 15 pages.
Non-final Office Action for U.S. Appl. No. 11/952,592 mailed Jun. 12, 2012, 28 pages.
Notice of Allowance for U.S. Appl. No. 11/952,617 mailed Jun. 4, 2012, 24 pages.
Notice of Allowance for U.S. Appl. No. 12/913,364 mailed Jun. 8, 2012, 12 pages.
Notice of Allowance mailed Oct. 2, 2008 for U.S. Appl. No. 11/199,319, now U.S. Patent 7,451,539.
Requirement for Restriction/Election mailed Mar. 26, 2008 for U.S. Appl. No. 11/199,319, now U.S. Patent 7,451,539.
Non-Final Rejection mailed May 21, 2010 for U.S. Appl. No. 11/435,913.
Final Rejection mailed Nov. 17, 2009 for U.S. Appl. No. 11/435,913.
Non-Final Rejection mailed Mar. 2, 2009 for U.S. Appl. No. 11/435,913.
Final Rejection mailed Aug. 15, 2008 for U.S. Appl. No. 11/435,913.
Non-Final Rejection mailed Jan. 7, 2008 for U.S. Appl. No. 11/435,913.
Requirement for Restriction/Election mailed Oct. 10, 2007 for U.S. Appl. No. 11/435,913.
Non-Final Rejection mailed Jan. 21, 2009 for U.S. Appl. No. 11/768,014.
Non-Final Rejection mailed Mar. 25, 2010 for U.S. Appl. No. 11/768,014.
Non-Final Rejection mailed Jul. 10, 2009 for U.S. Appl. No. 11/768,014.
Requirement for Restriction/Election mailed Sep. 29, 2008 for U.S. Appl. No. 11/768,014.
Non-Final Rejection mailed Jan. 8, 2010 for U.S. Appl. No. 11/952,484.
Final Rejection mailed Oct. 5, 2010 for U.S. Appl. No. 11/952,484.
Requirement for Restriction/Election mailed Sep. 11, 2009 for U.S. Appl. No. 11/952,484.
Non-Final Rejection mailed May 10, 2011 for U.S. Appl. No. 11/952,513.
Non-Final Rejection mailed Oct. 23, 2009 for U.S. Appl. No. 11/952,545.
Requirement for Restriction/Election mailed May 21, 2009 for U.S. Appl. No. 11/952,545.
Final Rejection mailed Feb. 24, 2011 for U.S. Appl. No. 11/952,592.
Non-Final Rejection mailed Dec. 15, 2010 for U.S. Appl. No. 11/952,592.
Non-Final Rejection mailed Jul. 28, 2009 for U.S. Appl. No. 11/952,592.
Final Rejection mailed Apr. 16, 2010 for U.S. Appl. No. 11/952,592.
Requirement for Restriction/Election mailed Jan. 26, 2009 for U.S. Appl. No. 11/952,592.
Requirement for Restriction/Election mailed Apr. 14, 2009 for U.S. Appl. No. 11/952,592.
Non-Final Rejection mailed Sep. 26, 2008 for U.S. Appl. No. 11/952,617.
Final Rejection mailed Nov. 20, 2009 for U.S. Appl. No. 11/952,617.
Requirement for Restriction/Election mailed Apr. 27, 2009 for U.S. Appl. No. 11/952,617.
Non-Final Rejection mailed Jun. 13, 2011 for U.S. Appl. No. 11/952,634.
Notice of Allowance mailed Mar. 3, 2011 for U.S. Appl. No. 11/952,634.
Final Rejection mailed Dec. 23, 2010 for U.S. Appl. No. 11/952,634.
Nonfinal Rejection mailed Jul. 21, 2010 for U.S. Appl. No. 11/952,634.
Requirement for Restriction/Election mailed May 12, 2010 for U.S. Appl. No. 11/952,634.
Non-Final Rejection mailed Jun. 22, 2011 for U.S. Appl. No. 11/952,670.
Non-Final Rejection mailed May 27, 2010 for U.S. Appl. No. 11/952,670.
Requirement for Restriction/Election mailed Jul. 22, 2009 for U.S. Appl. No. 11/952,670.
Supplemental Notice of Allowability mailed Oct. 12, 2010 for U.S. Appl. No. 11/952,690.
Supplemental Notice of Allowability mailed Sep. 27, 2010 for U.S. Appl. No. 11/952,690.
Notice of Allowance mailed Aug. 30, 2010 for U.S. Appl. No. 11/952,690.
Non-Final Rejection mailed Mar. 25, 2010 for U.S. Appl. No. 11/952,690.
Chomerics, "Cho-Shield Conductive Coatings," Web page copyright 2001, Chomerics, A Division of Parker Hannifin Corporation, Retrieved from http://www.chomerics.com/products/choshield_coatings.htm.
Chomerics, "Cho-Shield Conductive Coatings," Last modified Dec. 8, 2000, Chomerics, A Division of Parker Hannifin Corporation. http://www.chomerics.com/products/choshield_coatings.htm.
International Search Report for PCT/US2008/068153, mailed Dec. 9, 2008.
RF Micro Devices, Inc., "Fractional-N RF Synthesizer With Modulator and Digital IF Filter," RF6001, Rev A2, May 6, 2002, 2 pages.
Non-final Office Action for U.S. Appl. No. 12/766,347 mailed Jun. 29, 2012, 11 pages.
Notice of Allowance for U.S. Appl. No. 11/952,592 mailed Aug. 6, 2012, 7 pages.
Notice of Allowance for U.S. Appl. No. 11/952,670 mailed Aug. 24, 2012, 7 pages.
Notice of Allowance for U.S. Appl. No. 13/187,814 mailed Sep. 10, 2012, 8 pages.
Non-final Office Action for U.S. Appl. No. 13/415,643 mailed Jan. 3, 2013, 17 pages.
Notice of Allowance for U.S. Appl. No. 11/952,617 mailed Jan. 8, 2013, 8 pages.

(56) References Cited

OTHER PUBLICATIONS

Non-final Office Action for U.S. Appl. No. 12/797,381 mailed Jan. 8, 2013, 20 pages.
Final Office Action for U.S. Appl. No. 12/797,381, mailed May 16, 2013, 19 pages.
Notice of Allowance for U.S. Appl. No. 13/415,643, mailed Aug. 15, 2013, 8 pages.
Non-Final Office Action for U.S. Appl. No. 13/034,755, mailed Aug. 15, 2013, 6 pages.
Advisory Action for U.S. Appl. No. 12/797,381, mailed Jul. 17, 2013, 3 pages.
Quayle Action for U.S. Appl. No. 13/415,643, mailed Jul. 11, 2013, 6 pages.
Notice of Allowance for U.S. Appl. No. 13/151,499, mailed Dec. 19, 2013, 8 pages.
Examiner's Answer for U.S. Appl. No. 12/797,381, mailed Dec. 31, 2013, 6 pages.
Final Office Action for U.S. Appl. No. 13/034,755, mailed Jan. 31, 2014, 10 pages.
Advisory Action for U.S. Appl. No. 13/034,755, mailed Mar. 4, 2014, 3 pages.
Non-Final Office Action for U.S. Appl. No. 13/189,838, mailed Mar. 14, 2014, 14 pages.
Final Office Action for U.S. Appl. No. 13/189,838, mailed Jun. 19, 2014, 10 pages.

* cited by examiner

CONNECTION USING CONDUCTIVE VIAS

CROSS-REFERENCE TO RELATED APPLICATIONS

This application is related to application Ser. No. 12/030,711 entitled METHOD OF MAKING A CONFORMAL ELECTROMAGNETIC INTERFERENCE SHIELD, now U.S. Pat. No. 8,069,542; application Ser. No. 11/435,913 entitled SUB-MODULE CONFORMAL ELECTROMAGNETIC INTERFERENCE SHIELD, now U.S. Pat. No. 8,062,930; application Ser. No. 11/768,014 entitled INTEGRATED SHIELD FOR A NO-LEAD SEMICONDUCTOR DEVICE PACKAGE, now U.S. Pat. No. 8,053,872; application Ser. No. 11/952,484 entitled FIELD BARRIER STRUCTURES WITHIN A CONFORMAL SHIELD; application Ser. No. 11/952,513 entitled ISOLATED CONFORMAL SHIELDING, now U.S. Pat. No. 8,220,145; application Ser. No. 11/952,545 entitled CONFORMAL SHIELDING EMPLOYING SEGMENT BUILDUP; application Ser. No. 11/952,592 entitled CONFORMAL SHIELDING PROCESS USING FLUSH STRUCTURES, now U.S. Pat. No. 8,409,658; application Ser. No. 11/952,617 entitled HEAT SINK FORMED WITH CONFORMAL SHIELD, now U.S. Pat. No. 8,434,220; application Ser. No. 11/952,634 entitled CONFORMAL SHIELDING PROCESS USING PROCESS GASES, now U.S. Pat. No. 8,186,048; application Ser. No. 11/952,670 entitled BOTTOM SIDE SUPPORT STRUCTURE FOR CONFORMAL SHIELDING PROCESS, now U.S. Pat. No. 8,359,739; application Ser. No. 11/952,690 entitled BACKSIDE SEAL FOR CONFORMAL SHIELDING PROCESS, now U.S. Pat. No. 8,061,012; application Ser. No. 12/913,364 entitled BACKSIDE SEAL FOR CONFORMAL SHIELDING PROCESS, now U.S. Pat. No. 8,296,941; and application Ser. No. 12/797,381 entitled INTEGRATED POWER AMPLIFIER AND TRANSCEIVER; the disclosures of which are incorporated herein by reference in their entireties.

FIELD OF THE DISCLOSURE

The present disclosure relates to electronic modules having electromagnetic shields and methods of manufacturing the same.

BACKGROUND

Electronic components have become ubiquitous in modern society. The electronics industry routinely announces accelerated clocking speeds, higher transmission frequencies, and smaller integrated circuit modules. While the benefits of these devices are myriad, smaller electronic components that operate at higher frequencies also create problems. Higher operating frequencies mean shorter wavelengths, where shorter conductive elements within electronic circuitry may act as antennas to unintentionally broadcast electromagnetic emissions throughout the electromagnetic spectrum. If the signal strengths of the emissions are high enough, the emissions may interfere with the operation of an electronic component subjected to the emissions. Further, the Federal Communications Commission (FCC) and other regulatory agencies regulate these emissions, and as such, these emissions must be kept within regulatory requirements.

One way to reduce emissions is to form a shield around the modules. Typically, a shield is formed from a grounded conductive structure that covers a module or a portion thereof. When emissions from electronic components within the shield strike the interior surface of the shield, the electromagnetic emissions are electrically shorted through the grounded conductive structure that forms the shield, thereby reducing emissions. Likewise, when external emissions from outside the shield strike the exterior surface of the shield, a similar electrical short occurs, and the electronic components in the module do not experience the emissions.

If the electronic components in these modules are formed on a substrate, the conductive structure that forms the shield needs to be coupled to ground. However, the miniaturization of the modules makes it increasingly difficult to couple the shields to the ground. Furthermore, shielding the inner layers within the substrate becomes more and more important as miniaturization allows a greater density of these modules to be placed within a given area. Thus, what is needed is a shield structure that is easily coupled to ground and which provides more shielding of the inner layers within the substrate.

SUMMARY

The present disclosure may be used to form one or more electromagnetic shields for a given electronic module so that the electromagnetic shields are directly attached to one or more conductive vertical interconnect access structures (via) and thus may be easily connected to ground. In one embodiment, an electronic module is formed on a component portion that defines a component area on a surface of the substrate. To more easily attach the electromagnetic shield to ground, the electromagnetic shield may be directly attached to one or more of the conductive vias that are positioned about the periphery of the component portion. These conductive vias may be within and/or extend from the substrate and may be formed as part of a metallic structure associated with the component portion, which is configured to form a path to ground. The substrate may also have one or more vertically stacked metallic layers that extend along a periphery of the component portion and are attached to one another by the conductive vias. Thus, the metallic structure may be formed to have the conductive vias and metallic layers.

To form the electronic module, electronic components are provided on the component area and an overmold may then be provided to cover the component areas. Openings may be formed through at least the overmold to expose one or more of the conductive vias. An electromagnetic shield material may then be formed in the opening and over the overmold by applying an electromagnetic shield material. Since the exposed conductive vias are positioned at the periphery of the component portion, the electromagnetic shield can easily couple to the exposed conductive vias and connect to ground. Furthermore, precise cuts are not needed when exposing the conductive vias because the electromagnetic shield may couple to any section of the exposed conductive vias.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
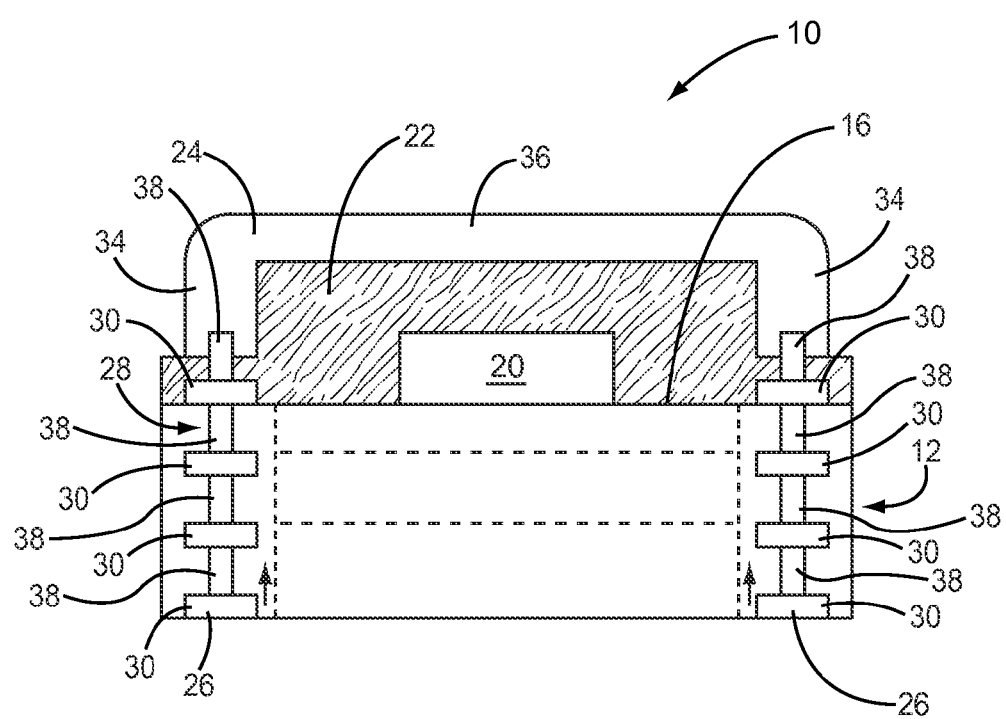
FIG. 1 illustrates one embodiment of an electronic module.

The present disclosure relates to shielded electronic modules and methods of manufacturing electromagnetic shields in electronic modules. The electromagnetic shields of the electronic module may be easily grounded by directly attaching at least one conductive vertical interconnect access structure (via) in a metallic structure that is either connected to ground or may be connected to ground. FIG. 1 illustrates one embodiment of an electronic module 10 that is manufactured in accordance with this disclosure. The electronic module 10 may be formed on a substrate 12. This substrate 12 may be made from any material(s) utilized to support electronic components. For example, substrate 12 may be formed from laminates such as FR-1, FR-2, FR-3, FR-4, FR-5, FR-6, CEM-1, CEM-2, CEM-3, CEM-4, CEM-5, and the like. Substrate 12 may also be formed from ceramics, and/or alumina.

The substrate 12 has a component portion 14 that supports the components of the electronic module 10 and may take up the entire substrate 12 or may take up only a particular portion of the substrate 12. For example, as explained in further detail below, the component portion 14 may be one of a plurality of component portions 14 on the substrate 12. The component portion 14 includes a component area 16 on a surface 18 of the substrate 12 and one or more electronic components 20 formed on the component area 16. Structures that form part of or are coupled to the electronic components 20 may be formed within the component portion 14. In addition, the component portion 14 may include conductive paths that form internal and external connections to and from the electronic module 10.

The electronic components 20 may be any type of electronic component. For example, electronic components 20 may be an electronic circuit built on its own semiconductor substrate, such as a processor, volatile memory, non-volatile memory, a radio frequency circuit, or a micro-mechanical system (MEMS) device. Electronic components 20 may also be electrical devices such as filters, capacitors, inductors, and resistors or electronic circuits having any combination of these electronic devices.

To protect the electronic components 20 from both internal and external electromagnetic emissions, an overmold 22 and electromagnetic shield 24 are formed over the component area 16 which cover the electronic components 20. The overmold 22 may be utilized to isolate the electronic components 20 and may include insulating or dielectric materials that prevent or substantially reduce both internal electromagnetic transmissions from the electronic components 20 and external electromagnetic transmissions generated outside of the electronic module 10. To couple the electromagnetic shield 24 to a ground plate 26 below the substrate 12, a metallic structure 28 is provided that extends through the component portion 14 and is attached to the electromagnetic shield 24. The metallic structure 28 includes a plurality of metallic layers 30, which in this embodiment are stacked over one another, and a plurality of conductive vias 38 that are between and directly attached to the metallic layers 30. The conductive vias 38 provide an electrical connection to one another through their attachement to the metallic layers 30. In the alternative, the conductive vias 38 may not be directly attached to the metallic layers 30 and may indirectly connect to the metallic layers 30. In this case, the conductive vias 38 may be electrically connected to the metallic layers 30 by other structures within the metallic structure 28. In yet another alternative embodiment, the conductive vias 38 may be directly connected to one another without the use of the metallic layers 30. The metallic layers 30 extend along a periphery 32 of the component portion 14 while the conductive vias are positioned along the periphery 32. The periphery 32 may be defined as any boundary line, area, or volume at the boundary of the component portion 14. As shall be explained in further detail below, the plurality of conductive vias 38 may be provided to surround the component portion 14.

Lateral portions 34 of the electromagnetic shield 24 extend downward from a top portion 36 of the electromagnetic shield 24 to directly attach the electromagnetic shield 24 to metallic structure 28. The lateral portions 34 may be directly attached to one or more of these conductive vias 38. In this embodiment, the electromagnetic shield 24 is coupled to the plurality of conductive vias 38 that are positioned at a perimeter of the component area 16 and extend above the surface 18 of the substrate 12. However, the electromagnetic shield 24 may be directly attached to any of the conductive vias 38 so that the electromagnetic shield 24 makes electrical contact with the metallic structure 28. Since the conductive vias 38 are positioned at the periphery 32 of the component portion 14, the conductive vias 38 make it easier to electrically connect the electromagnetic shield 24 to the ground plate 26. The conductive vias 38 may be any type of structure utilized to connect components on different vertical levels through a substrate 12. For example, conductive vias 38 may be formed as plated through-holes, conductive pillars, conductive bars, and the like.

The metallic layers 30 and conductive vias 38 may extend along or be at the periphery 32 (or a perimeter) by being within, adjacent to, close to, or defining the periphery 32 of the component portion 14. In some embodiments, the metallic layers 30 extend about only a portion of the periphery 32. However, as shall be explained in further detail below, the metallic layers 30 in this embodiment extend along the entire periphery 32 so that each circumscribes a horizontal cross-section of the component portion 14. Similarly, the conductive vias 38 may be at a particular location or section of the periphery 32 or about of the entire periphery 32.

Figure 1A:
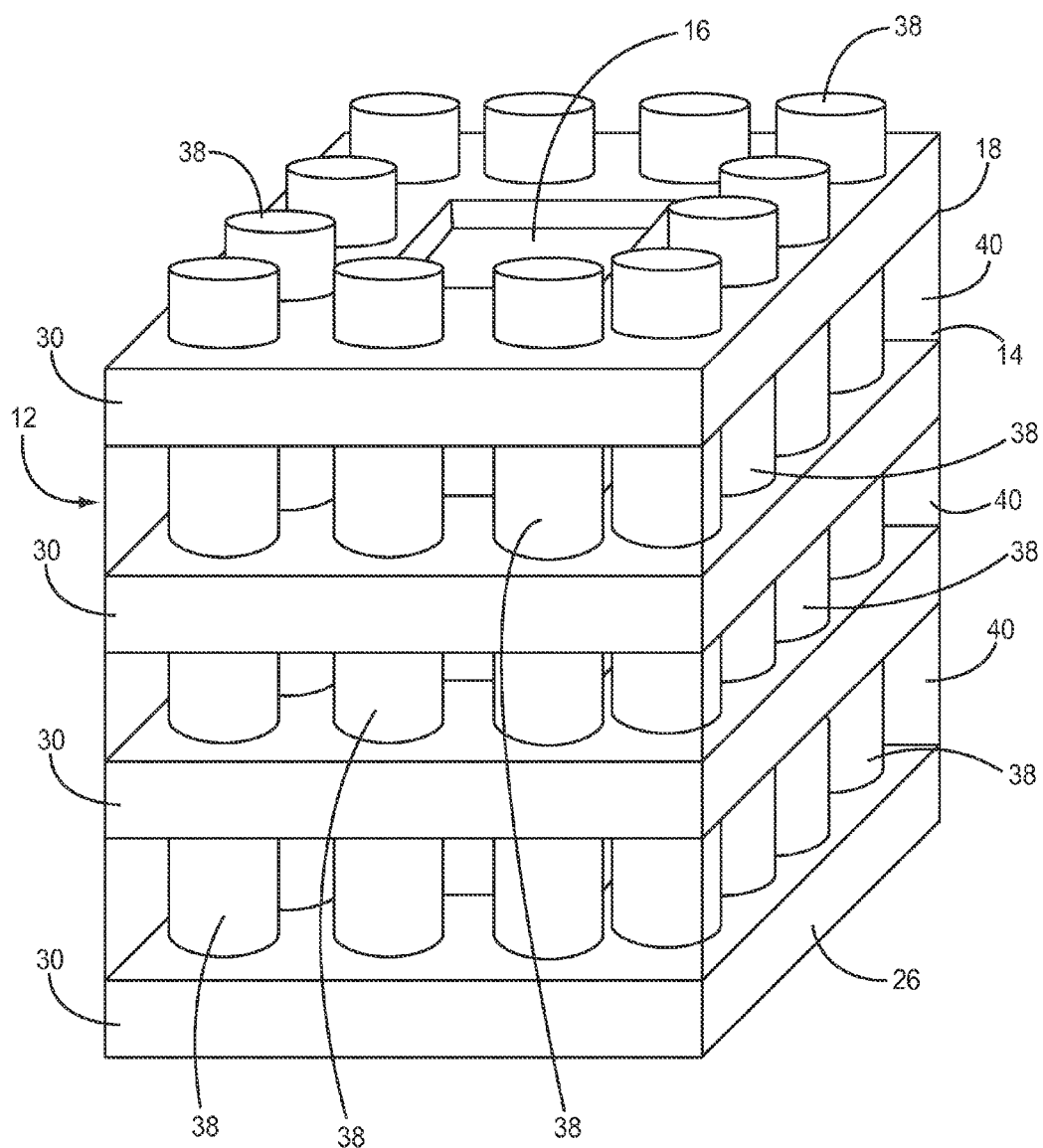
FIGS. 1A-1E illustrates steps for forming the electronic module of FIG. 1.
Figure 1B:
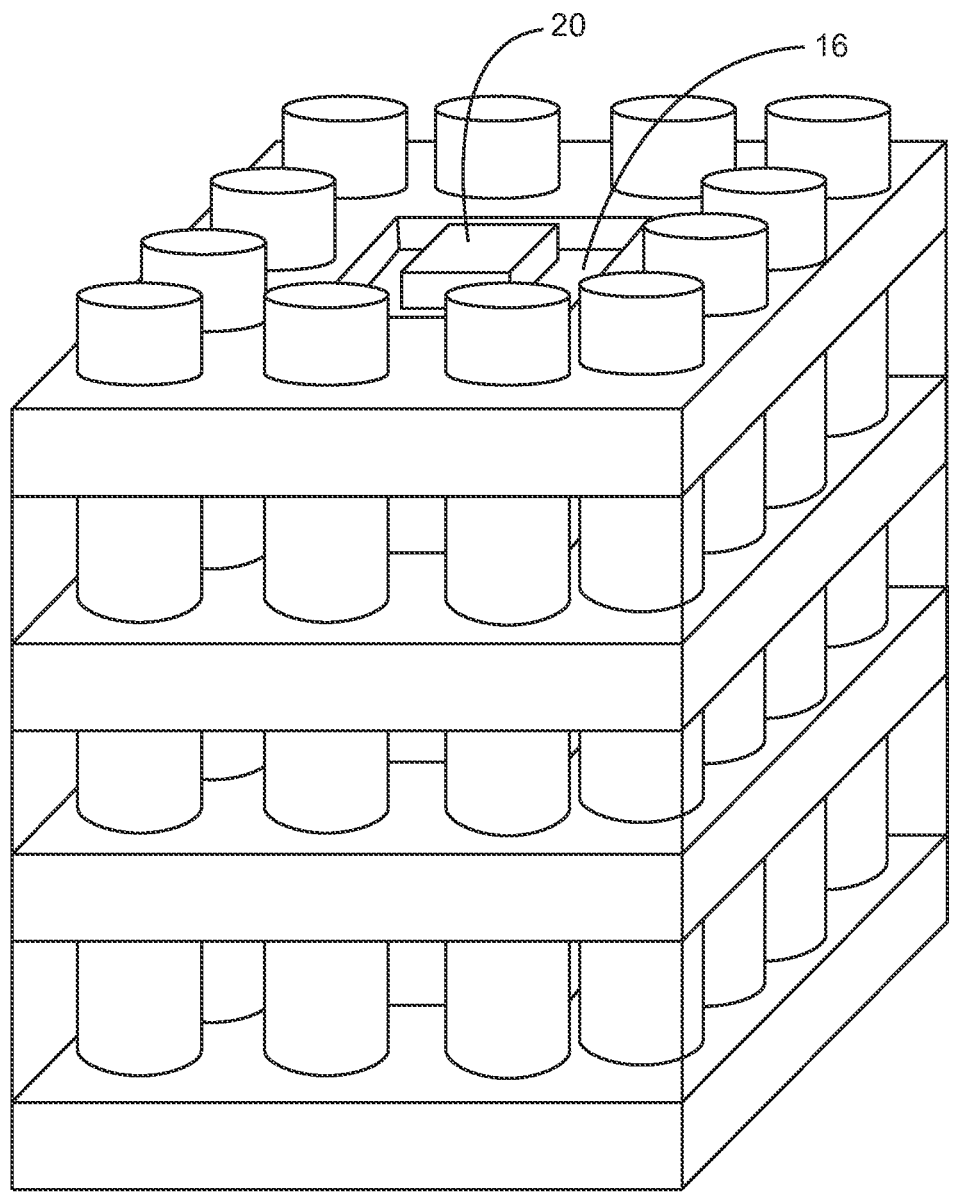

FIGS. 1A-1E illustrates a series of steps for manufacturing the electronic module 10 illustrated in FIG. 1. It should be noted that the order of these steps are simply illustrative and the steps may be performed in a different order. Furthermore, the steps are not meant to be exhaustive and other steps and different steps may be utilized to manufacture the electronic module 10, as shall be recognized by those of ordinary skill in the art. The same is true for steps discussed throughout this disclosure. First, the substrate 12 is provided (FIG. 1A). Substrate 12 may be formed from vertically stacked insulating substrate layers 40 that make up the body of the component portion 14. The vertically stacked insulating substrate layers 40 may be formed from one or more dielectric or insulating materials. In this embodiment, the component portion 14 has been formed over the ground plate 26.

There are metallic layers 30 on the top surface 18 of the component portion 14, between each of the vertically stacked insulating substrate layers 40, and at the bottom of the component portion 14, which is the ground plate 26. The metallic layers 30 extend about the vertically stacked insulating substrate layers 40 of the component portion 14 to circumscribe a horizontal cross-sectional area of the component portion 14. For example, the top metallic layer 30 on the surface 18 of the component portion 14 surrounds a perimeter of the component area 16. Substrate 12 may include additional layers above, below, and between vertically stacked insulating substrate layers 40 and metallic layers 30 depending on the application for the electronic module 10.

The plurality of conductive vias 38 are positioned between the metallic layers 30 and may be directly attached to the metallic layers 30 to electrically connect them. The conductive vias 38 may be utilized to form a conductive path to the ground plate 26. In other embodiments, conductive vias 38 may be utilized to form conductive paths for internal or external connections. For example, a common ground node may physically displaced from the electronic module and thus conductive vias 38 may be utilized to form a path to an external connection that couples the metallic structure 28 to the ground node.

The metallic layers 30 and conductive vias 38 also provide shielding for the vertically stacked insulating substrate layers 40 within the component portion 14 of the substrate 12. As explained above, metallic layers 30 surround the periphery 32 of the component portion 14 thereby circumventing a horizontal cross-section of the component portion 14. A set of the plurality of conductive vias 38 above and between each of the metallic layers 30 substantially surround the perimeter 32 to circumvent the portions of the periphery 32 between the metallic layers 30 and the component area 16. These conductive vias 38 are discrete from one another and thus do not fully surround the perimeter 32 of the component portion 14. Consequently, gaps between the conductive vias 38 are exposed. However, conductive vias 38 may be provided close enough to one another so as to present an electromagnetic barrier to electromagnetic emissions. The metallic layers 30 may be made from any type of metal such as, for example, copper (Cu), gold (Au), silver (Ag), Nickel (Ni). The metallic material may also include metallic alloys and other metallic materials mixed with or forming ionic or covalent bonds with other non-metallic materials to provide a desired material property.

Figure 1C:
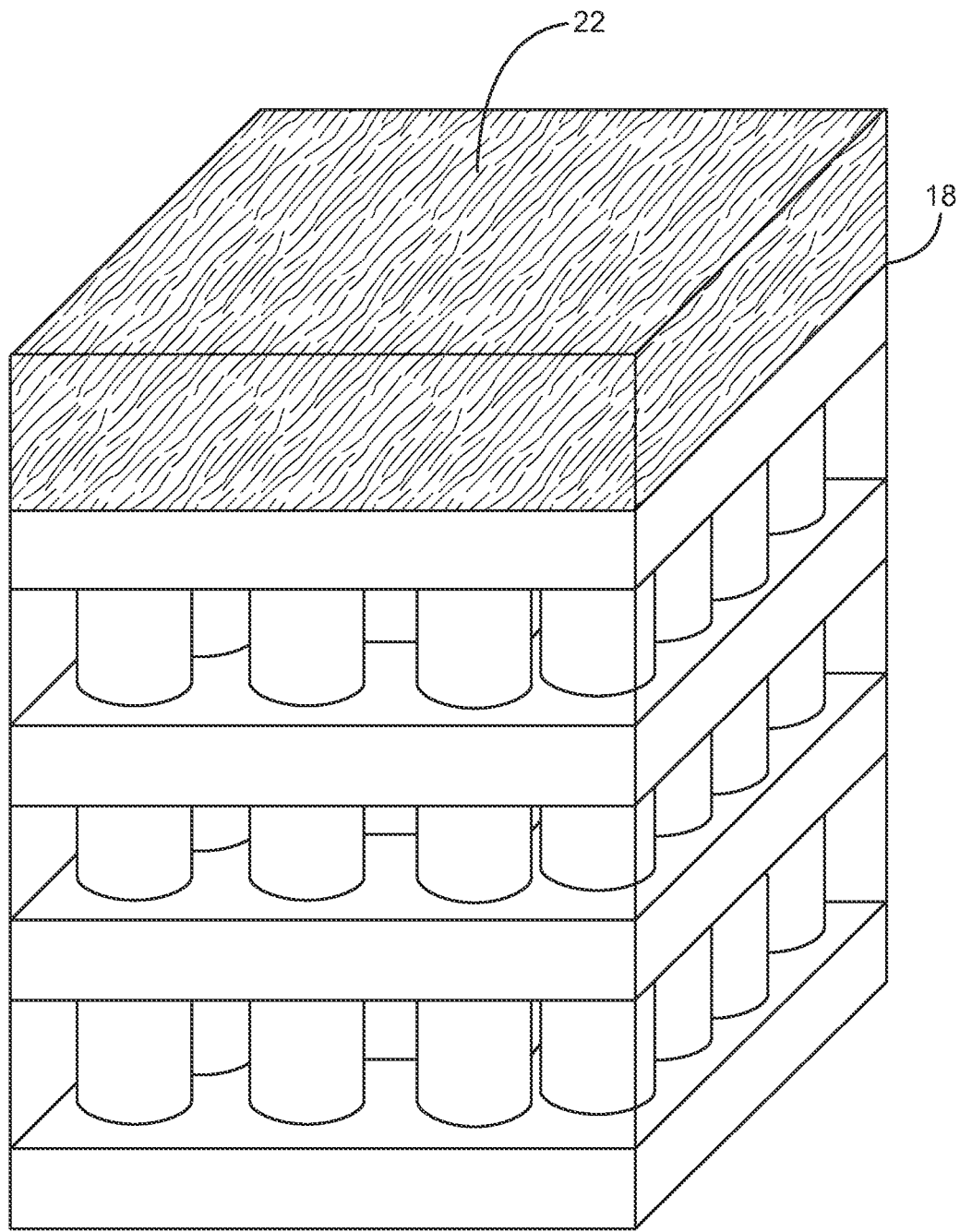
Figure 1D:
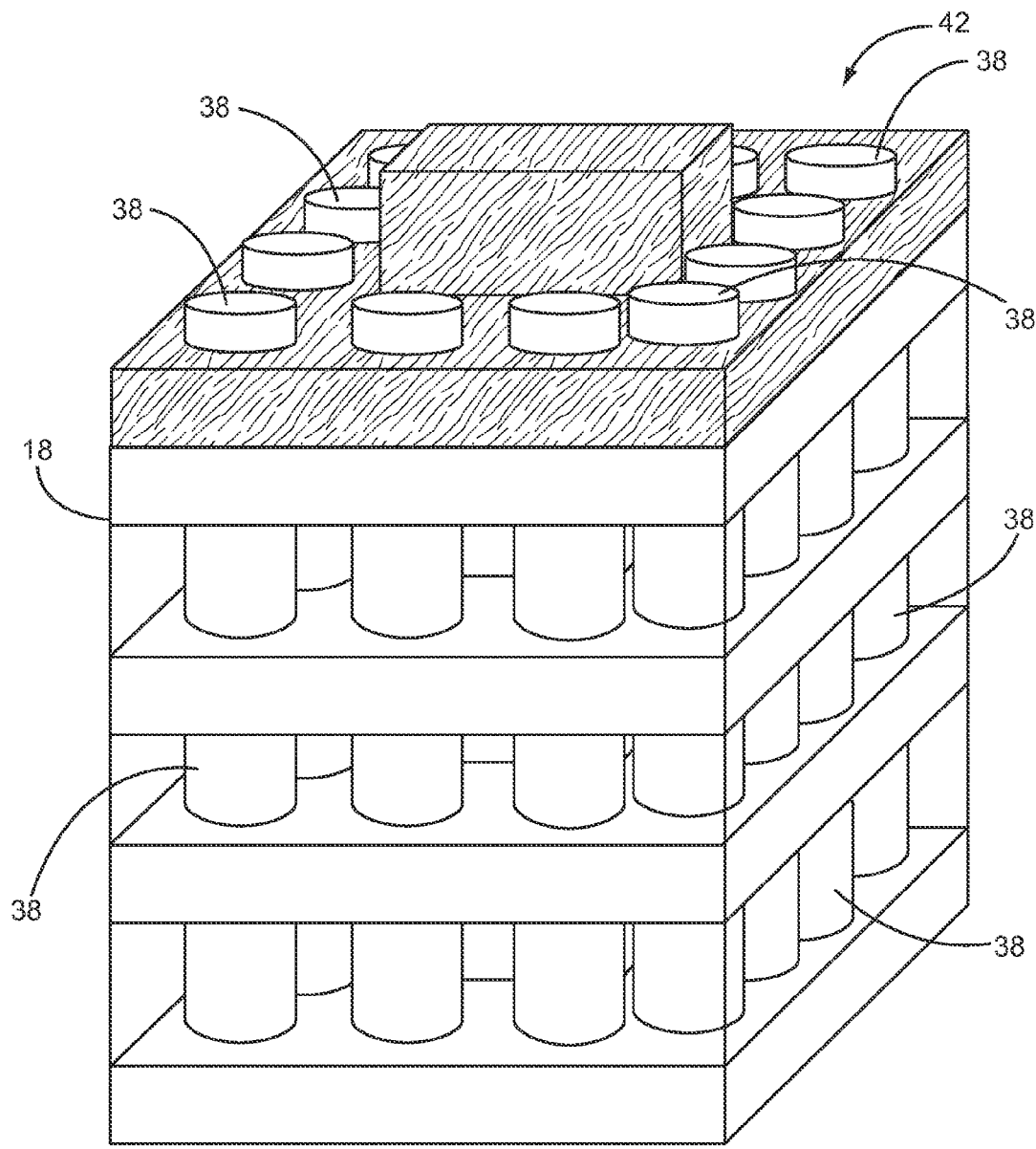
Figure 1E:
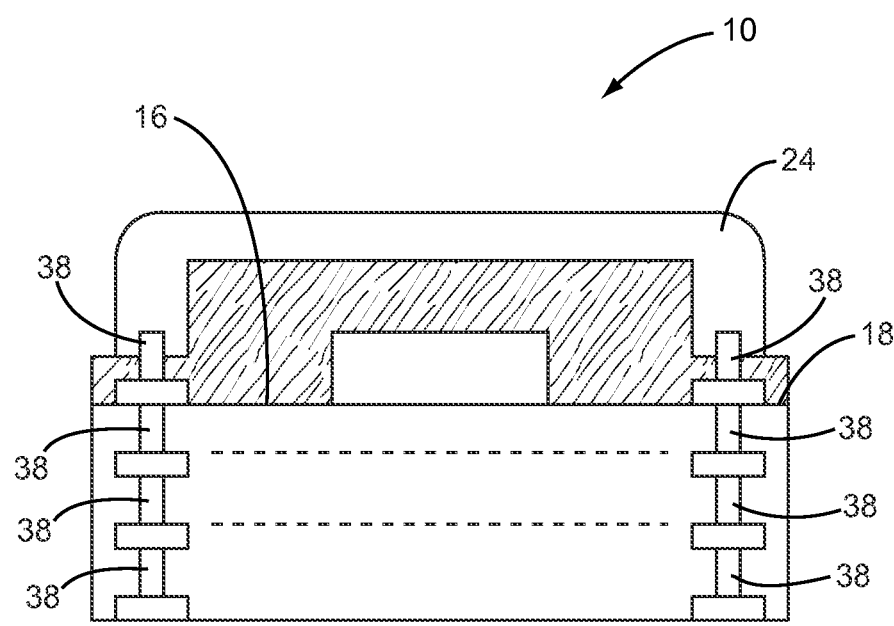

Next, electronic components 20 may be provided on the component area 16 (FIG. 1B) and the overmold 22 is provided over the surface 18 to cover the component area 16 (FIG. 1C). In this embodiment, an opening 42 is formed through the overmold 22 to the set of conductive vias 38 that extend above the surface 18 of the substrate 12 (FIG. 1D). A seed layer (not shown) may then be provided over the overmold 22 and conductive vias 38. An electromagnetic shield material may then be applied onto the seed layer by, for example, an electrolytic or electroless plating process so that the electromagnetic shield material builds on the set of conductive vias 38 that extend above the surface 18 of the substrate 12 and are within the opening 42. This forms the electromagnetic shield 24 over the component area 16 and the electromagnetic shield 24 is directly attached to the set of conductive vias 38 that extend over the surface 18 of the substrate 12 to form the electronic module 10 (FIG. 1E).

Figure 2A:
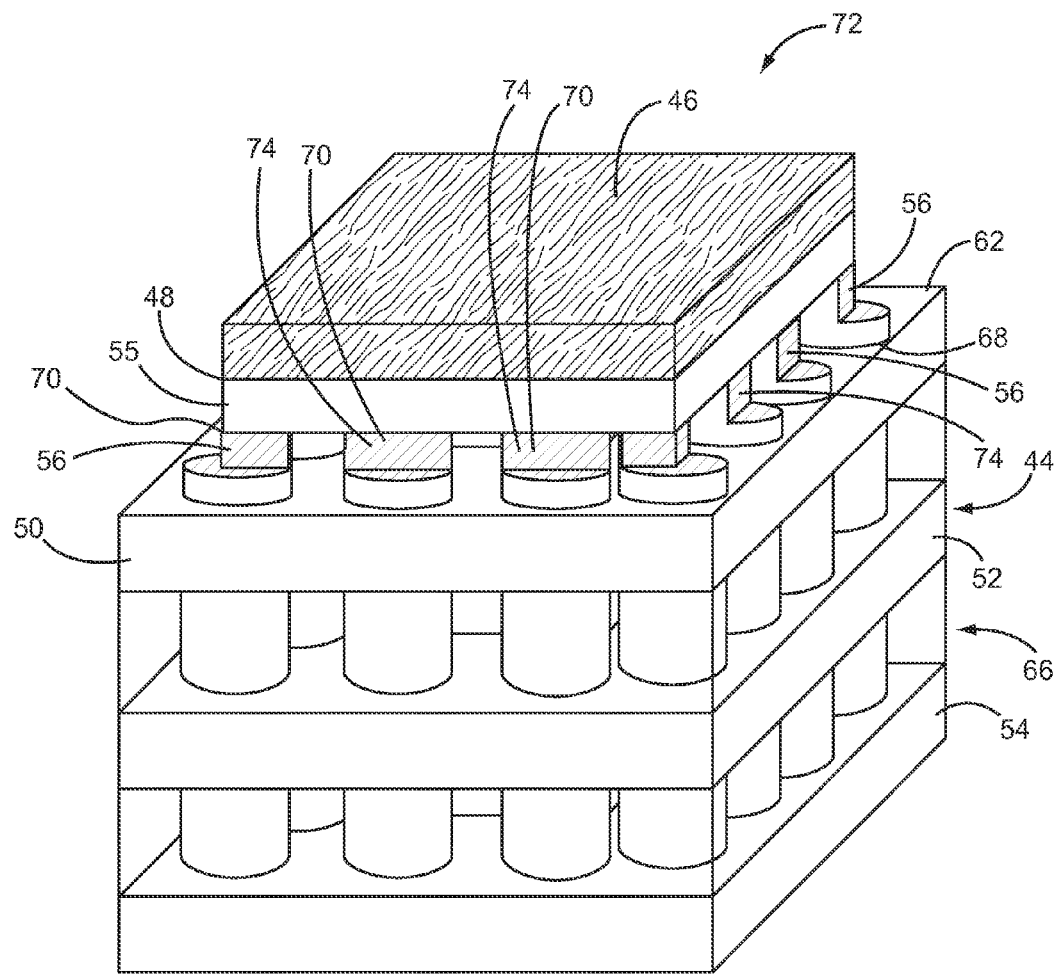
FIGS. 2A-2B illustrates steps for forming another embodiment of an electronic module.
Figure 2B:
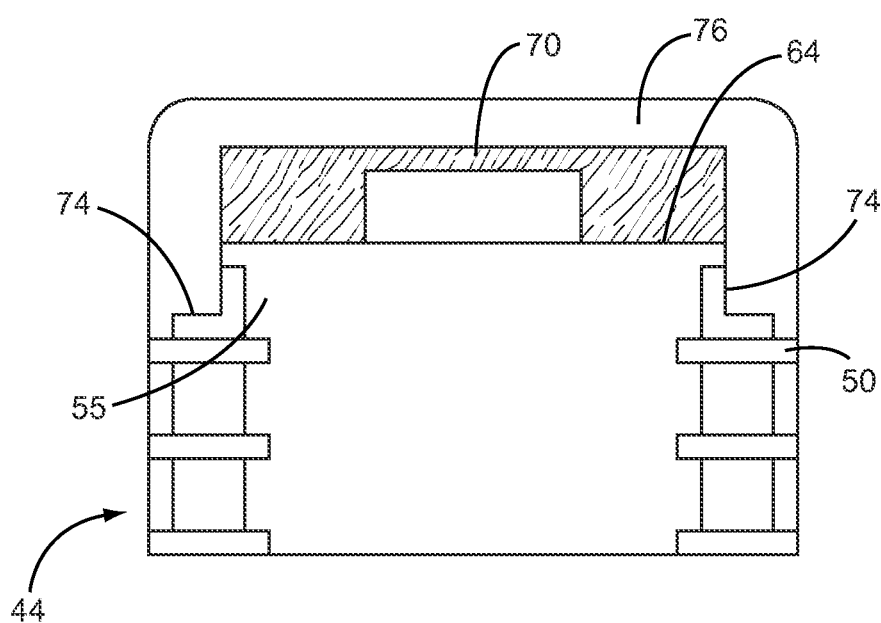

FIGS. 2A and 2B illustrates steps for manufacturing another embodiment of an electronic module. In FIG. 2A, the substrate 44 and an overmold 46 are provided utilizing essentially the same steps as described above in FIGS. 1A-1D. In this embodiment, a cut has been made through the overmold 46 and into the substrate 44 that has removed the top metallic layer (not shown). Thus, the top metallic layer that once rested on a surface 48 of the substrate 44 has been cut away. Instead, the substrate now has first, second, and third metallic layers 50, 52, 54 within or below the substrate 44. The cut has also cut into a top insulating substrate layer 55 of the substrate 44 and into a first set of conductive vias 56. Thus, prior to making the cut, the first set of conductive vias 56 were internally within the substrate 44. A second and third set of conductive vias 58, 60 are also provided and remain within the substrate 44 after the cut, as shown in FIG. 2A. In this embodiment, the first set of conductive vias 56 are positioned above the first metallic layer 50 and extend above a surface 62 of the substrate 44 to surround a component area 64 (shown in 2B) of a component portion 66 in the substrate 44. The first set of conductive vias 56 have a first end 68 attached to the first metallic layer 50 within the substrate 44 and a second end 70 that extends above the surface 62 of the substrate 44.

As shown in FIG. 2A, an opening 72 is formed by the cut along a periphery of the component portion 66 through the overmold 46 and into the first set of conductive vias 56 to expose sections 74 on the second ends 70 of the first set of conductive vias 56. However, the cut may also be formed to expose any section of any of the first, second, or third set of conductive vias 56, 58, 60. In this embodiment, the opening 72 actually penetrates into the conductive vias 56. An electromagnetic shield material may then be applied over the overmold 46 and the sections 74 within the opening 72 to form the electromagnetic shield 76 (FIG. 2B) which is directly attached to the sections 74 of the first set of conductive vias 56.

The first, second, or third set of conductive vias 56, 58, 60 may be any type of structure utilized to connect components on different vertical levels through the substrate 44. For example, first, second, or third set of conductive vias 56, 58, 60 may be formed as plated through-holes, conductive pillars, conductive bars, and the like. In addition, first, second, or third set of conductive vias 56, 58, 60 may be attached to the first, second, and/or third metallic layers 50, 52, 54 by being separate or distinct pieces that have been connected to one another or by being integrated and unsegregated pieces.

It should be noted a grinding process may be utilized to make a cut that exposes any section of any of the first, second, or third set of conductive vias 56, 58, 60. Since any section of any of the first, second, or third set of conductive vias 56, 58, 60 can be utilized to couple to the electromagnetic shield 76, the accuracy required in making the cuts and create the opening 72 is reduced.

Figure 3A:
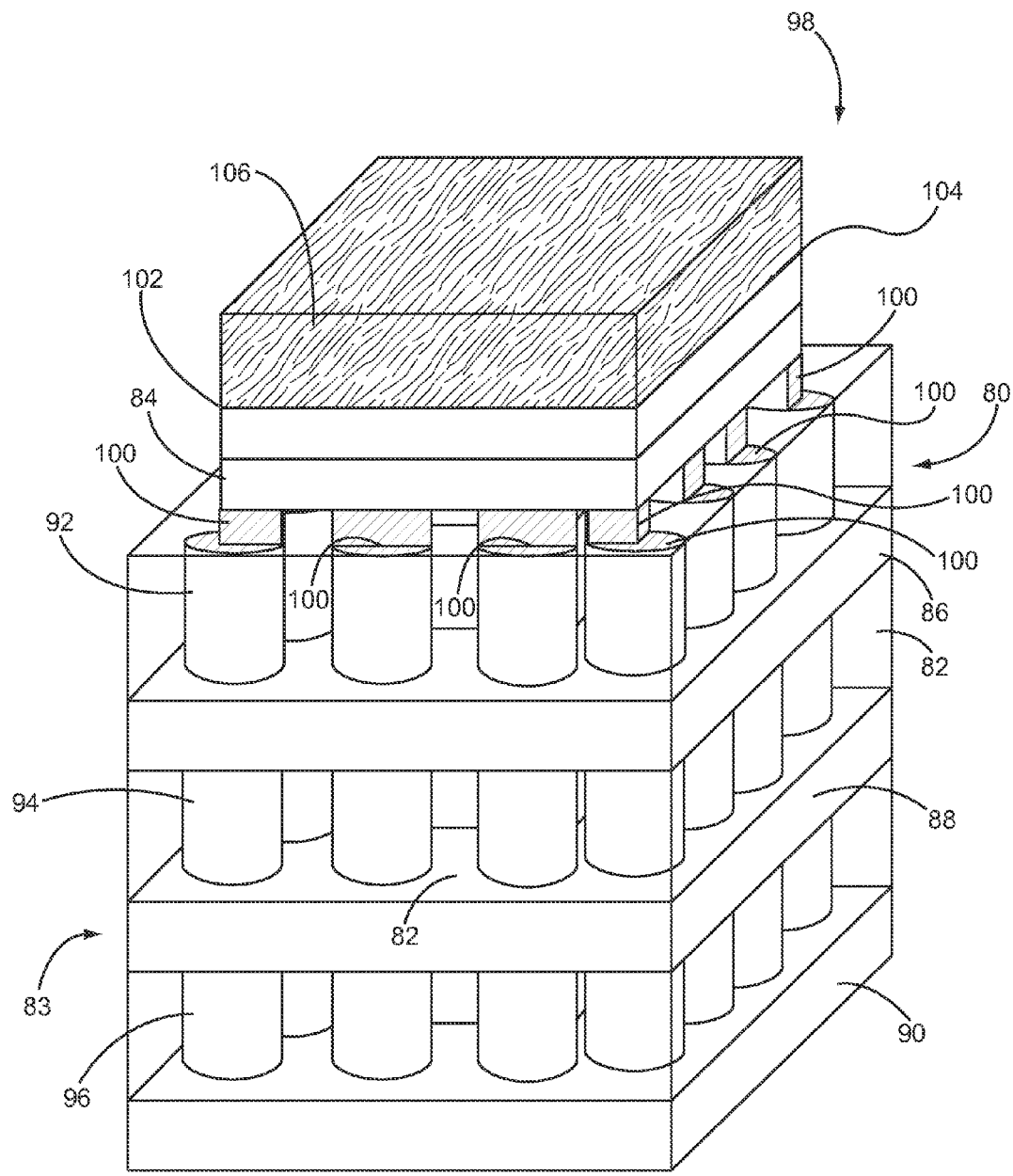
FIGS. 3A-3B illustrates steps for forming yet another embodiment of an electronic module.
Figure 3B:
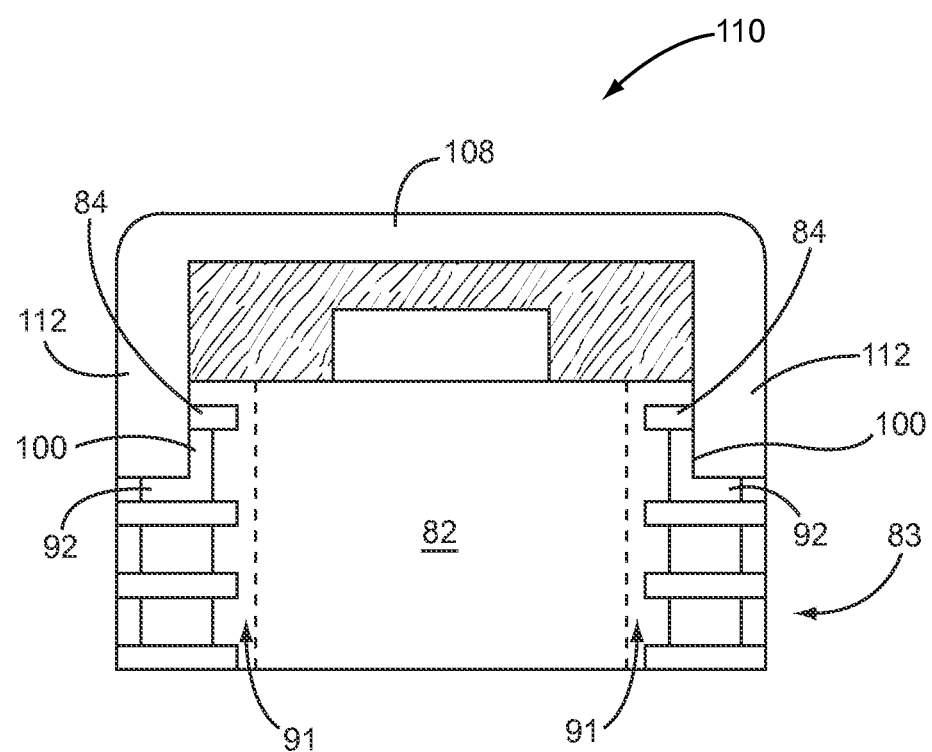

For example, FIG. 3A and FIG. 3B illustrate steps for manufacturing yet another embodiment of an electronic module. In this embodiment, a substrate 80, shown in FIG. 3A, has a substrate body 82 that defines a component portion 83. The substrate 80 has a stack of a first, second, third, and fourth metallic layers 84, 86, 88, 90 that extend along a periphery 91 (shown in FIG. 3B) of the component portion 83. In this example, the first, second, third, and fourth metallic layers 84, 86, 88, 90 extend about the entire periphery 91 of the component portion 83 to surround the component portion 83. In alternative embodiments, the first, second, third, and fourth metallic layers 84, 86, 88, 90, may only extend along a portion of the periphery 91. Attached to and between the first, second, third, and fourth metallic layers 84, 86, 88, 90 are the first, second, and third sets of conductive vias 92, 94, 96.

As shown in FIG. 3A, an opening 98 has been formed into the substrate body 82, through the first metallic layer 84, and into the first set of conductive vias 92. The cut that forms the opening 98 forms sections 100 of the first set of conductive vias 92 which are now exposed by the opening 98. The sections 100 and the first set of conductive vias 92 are positioned below a component area 102 on a surface 104 of the substrate body 82. As in the previous embodiment, an overmold 106 was provided over the surface 104 to cover the component area 102 and thus, the opening 98 was also formed by cutting through the overmold 106. Since any section 100 of the first set of component vias 92 may be exposed to connect an electromagnetic shield to ground, the sections 100 may be formed anywhere on the surface or within the first set of conductive vias 92. Consequently, less accuracy is required in making cuts when creating the opening 98.

Next, a seed layer (not shown) may be provided on the overmold 106 and within the opening 98. An electromagnetic shield material is applied to this seed layer to form the electromagnetic shield 108, as illustrated in FIG. 3B to form the electronic module 110. In this embodiment of the electronic module 110, the electromagnetic shield 108 is directly attached to the sections 100 of the first set of conductive vias 92 and also to the remaining parts of the first metallic layer 84. Consequently, lateral portions 112 of the electromagnetic shield 108 are formed to shield part of the substrate body 82 in the component portion 83 and thus providing shielding to internal portions of the substrate 80. However, the opening 98 (illustrated in FIG. 3A) may be formed to expose any section of any of the first, second, and third sets of conductive vias 92, 94, 96. In this manner, the depth of the lateral portions 112 can be controlled so that the electromagnetic shield 108 shields any desired part of the periphery 91 of the component portion 83.

Figure 4:
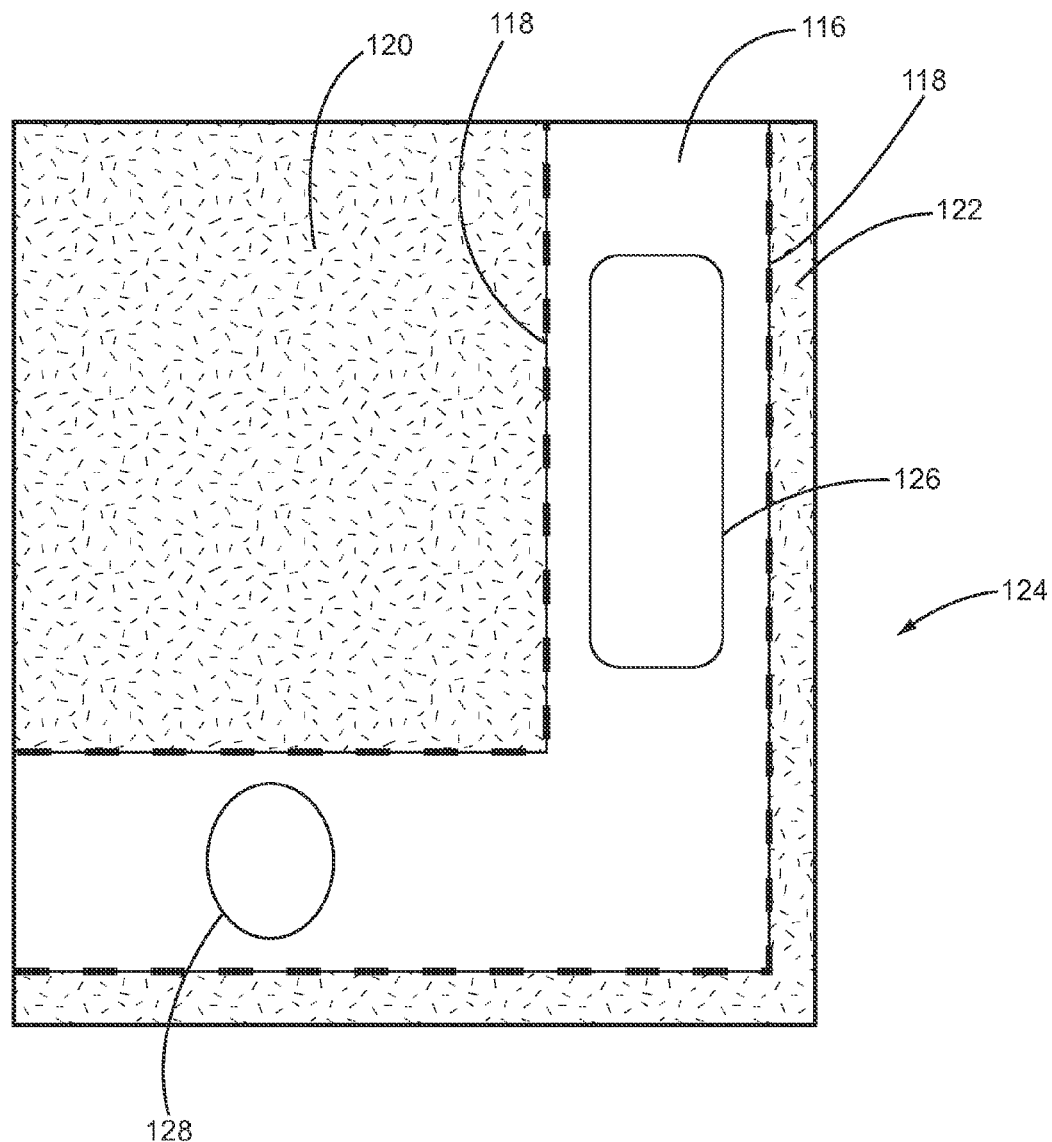
FIG. 4 is a top down view of one embodiment of a metallic layer that extends along a perimeter of a component area on a surface of a substrate.

FIG. 4 is a top down view of a metallic layer 116 that extends along a perimeter 118 of a component area 120 on a surface 122 of a substrate 124. Illustrated on the metallic layer 116 are projections 126, 128 of conductive vias attached below the metallic layer 116. In this particular embodiment, the conductive vias are solid metal bars and the projection 126 is of a circular shaped conductive metal bar and projection 128 is of a slot shaped conductive metal bar. These shapes are advantageous because they provide a large solid volume for cuts thereby decreasing the accuracy required in making cuts so that an electromagnetic shield appropriately connects to ground. These conductive vias may be made from any type of conductive material such as metals like, for example, copper (Cu), gold (Au), silver (Ag), Nickel (Ni). The conductive material may also include metallic alloys and other conductive materials mixed with or forming ionic or covalent bonds with other non-conductive materials to provide a desired material property.

Figure 5:
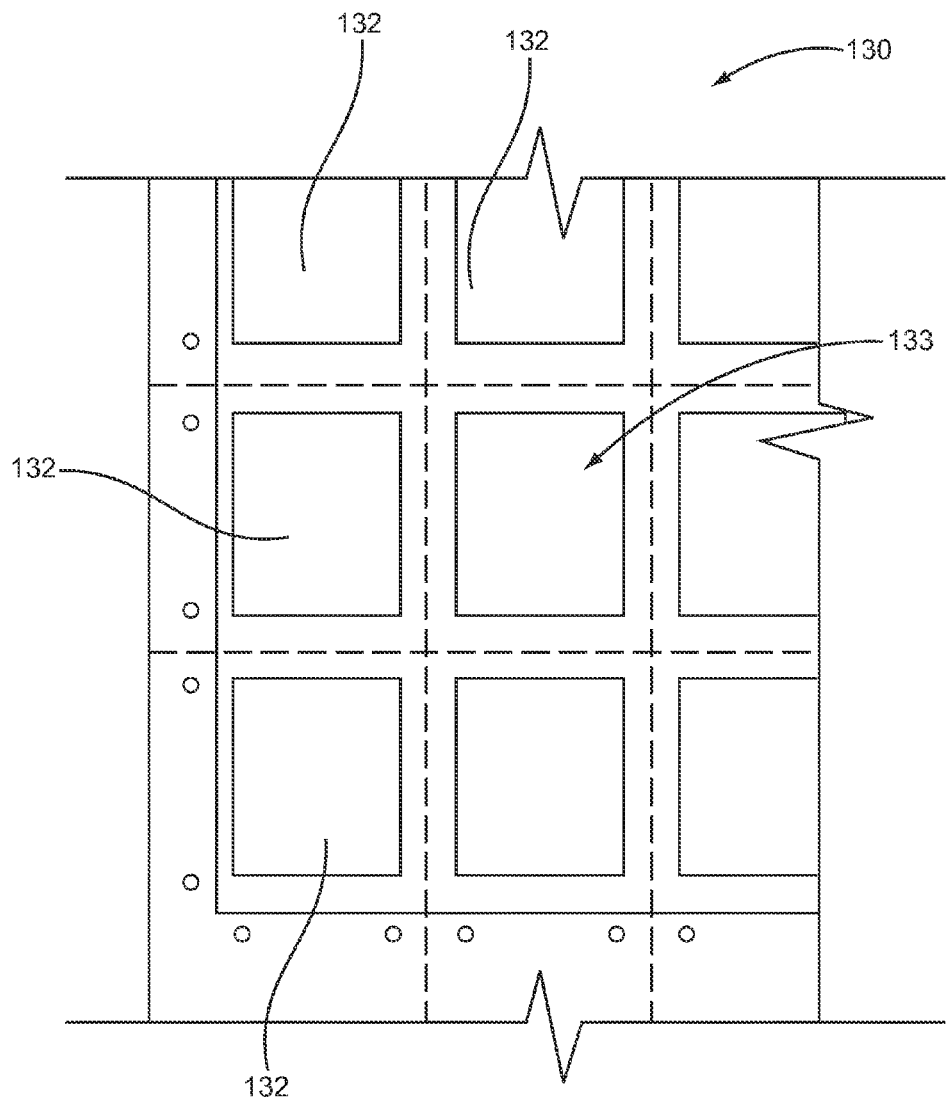
FIG. 5 illustrates one embodiment of an electronic meta-module.
Figure 6:
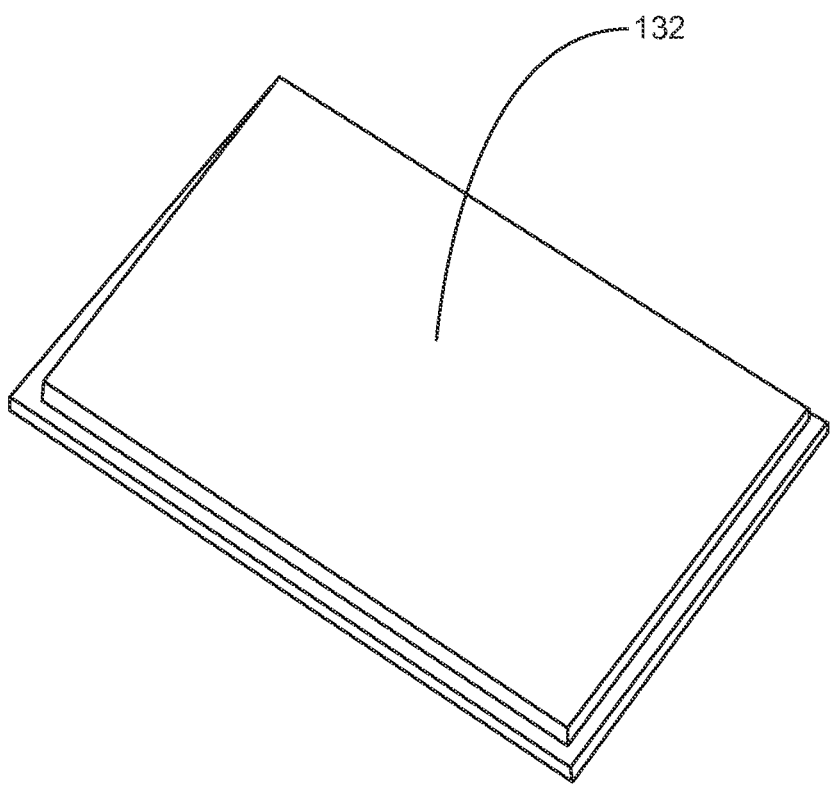
FIG. 6 illustrates one embodiment of an electronic module singulated from the electronic meta-module in FIG. 5.

Referring now to FIG. 5, one embodiment of an electronic meta-module 130 having a plurality of shielded electronic modules 132 is shown. In this example, the plurality of shielded electronic modules 132 is arranged as an array 133 of shielded electronic modules 132. The array 133 may be of any shape, however, in this example, the array 133 is a rectangular array that arranges the plurality of shielded electronic modules 132 in rows and columns. As shown in FIG. 6, these shielded electronic modules 132 may be singulated from the electronic meta-module 130 to provide individual shielded electronic modules 132.

Figure 7A:
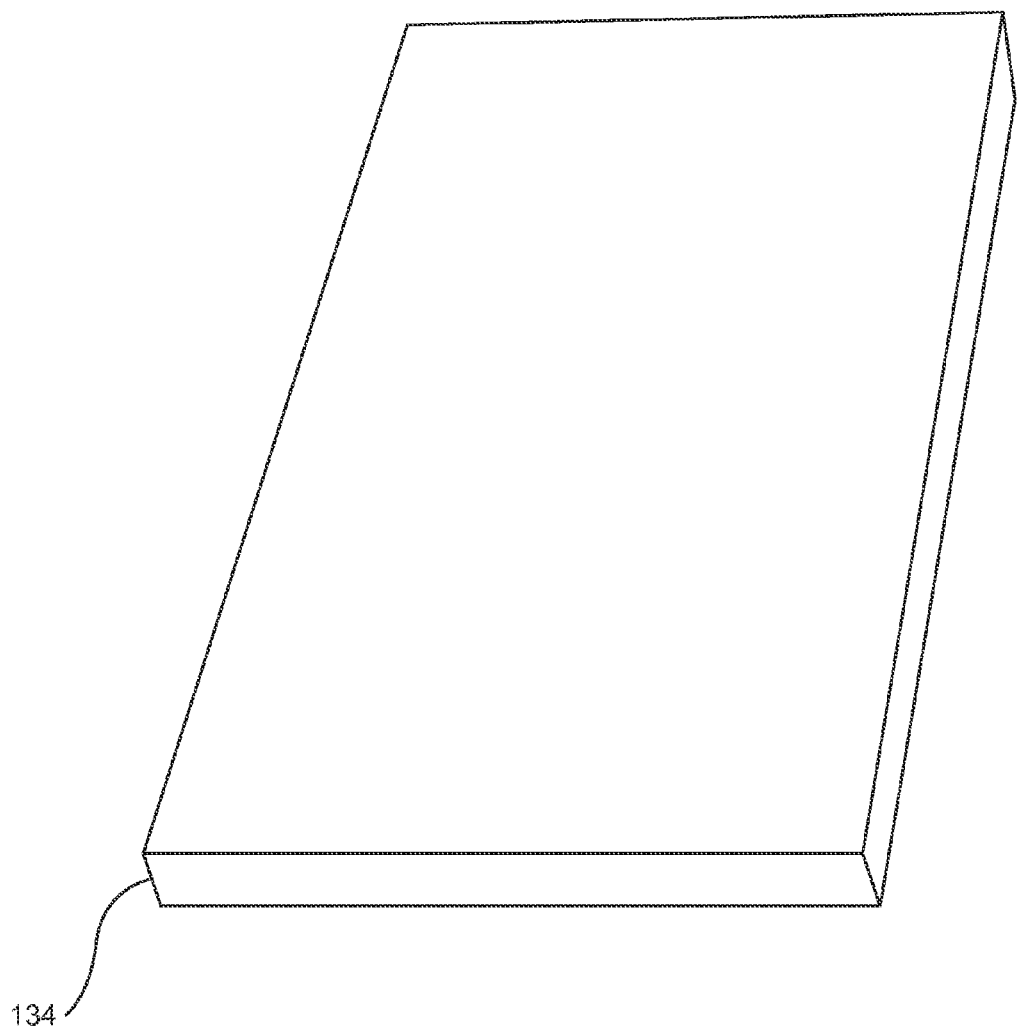
FIGS. 7A-7L illustrates steps for forming the electronic meta-module of FIG. 5.
Figure 7B:
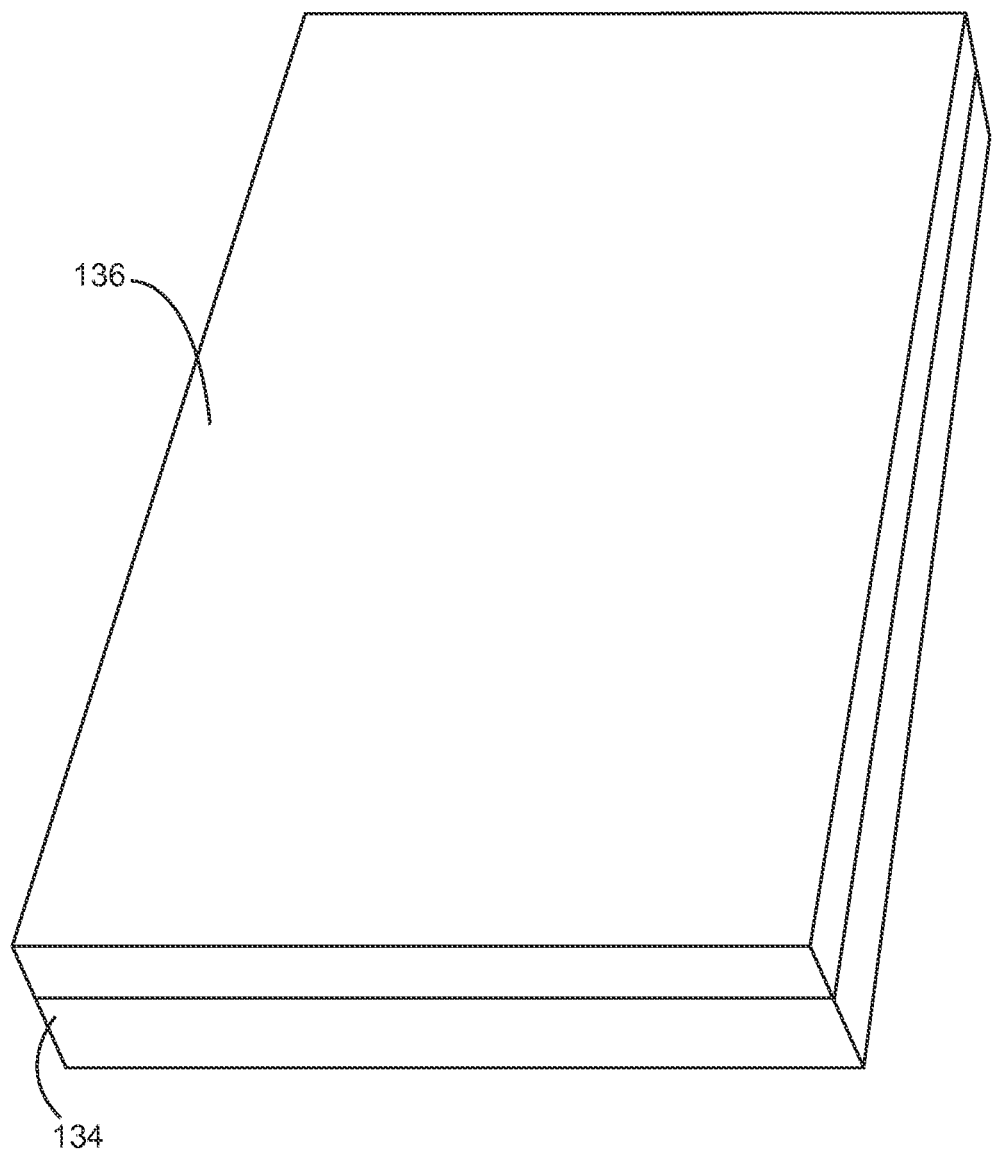
Figure 7C:
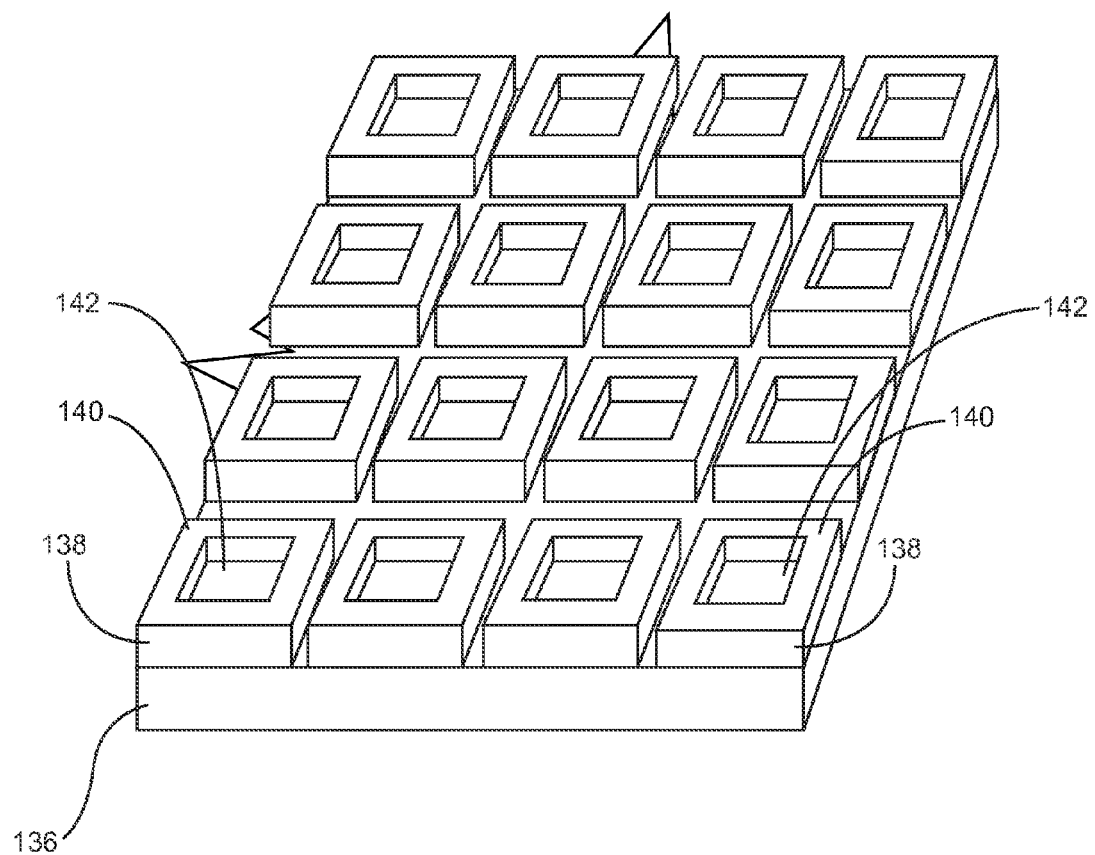

FIGS. 7A-7L illustrates a series of steps for manufacturing the electronic meta-module 130. To create the substrate for the electronic meta-module 130, a carrier metallic layer 134 is first provided (FIG. 7A) and a first metallic sheet 136 is formed on the carrier metallic layer 134 (FIG. 7B). Photolithography may be utilized to form the metallic sheet 136 into a first metallic layer 138 of a plurality of metallic structures 140 (FIG. 7C). Photolithography may also be utilized to form circuitry (not shown). This circuitry may form part of the first metallic layers 138, be within the first metallic layers 138, couple the first metallic layers 138, and/or form structures that are not part of the first metallic layers 138. The first metallic layers 138 of the illustrated embodiment are separated from one another because the plurality of metallic structures 140 are to be built as separated structures. Also, each of these first metallic layers 138 surrounds and defines an aperture 142 which may include the circuitry discussed above (not shown). In other embodiments, the first metallic layers 138 may simply be a metallic strip and thus would not define the aperture 142.

Figure 7D:
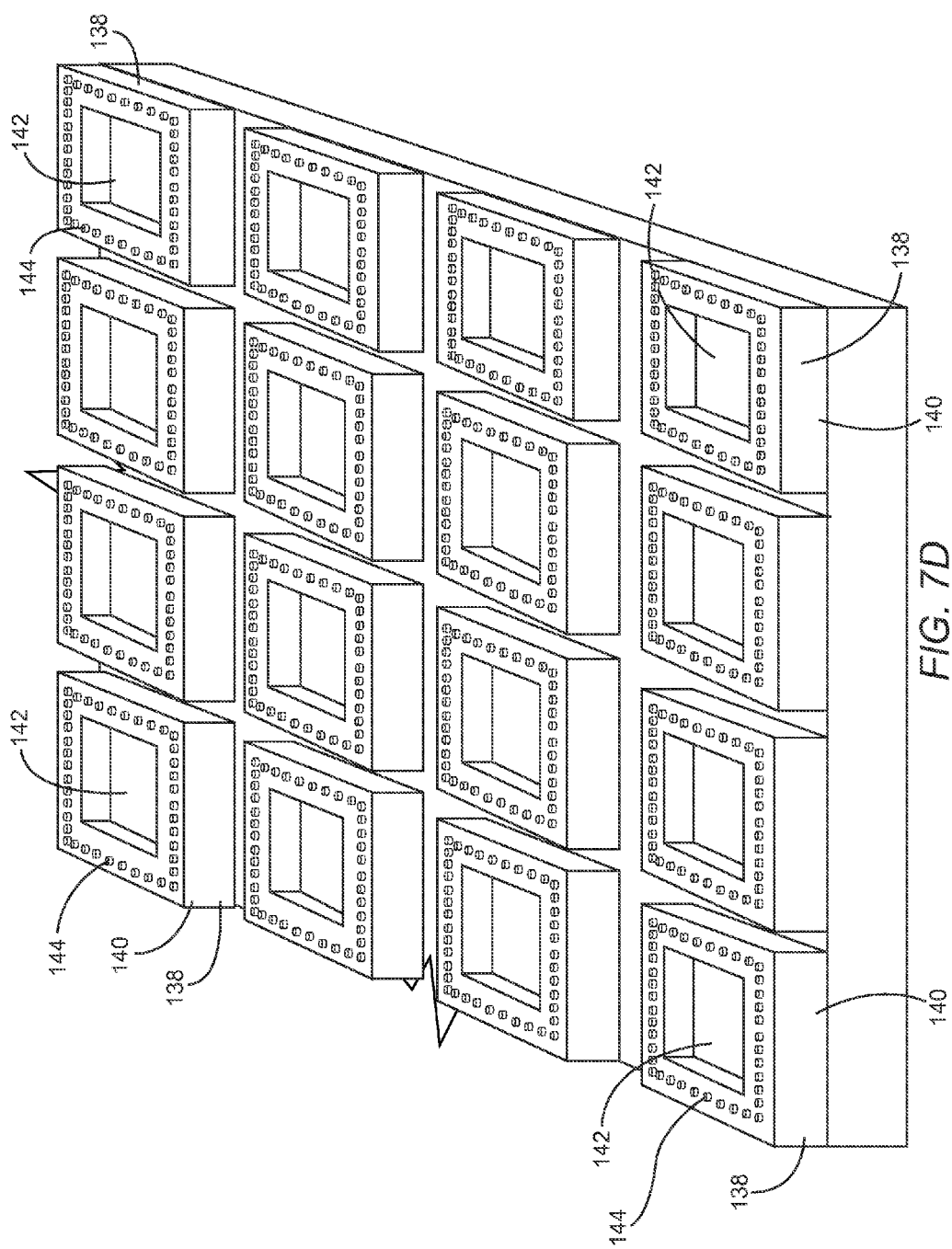
Figure 7E:
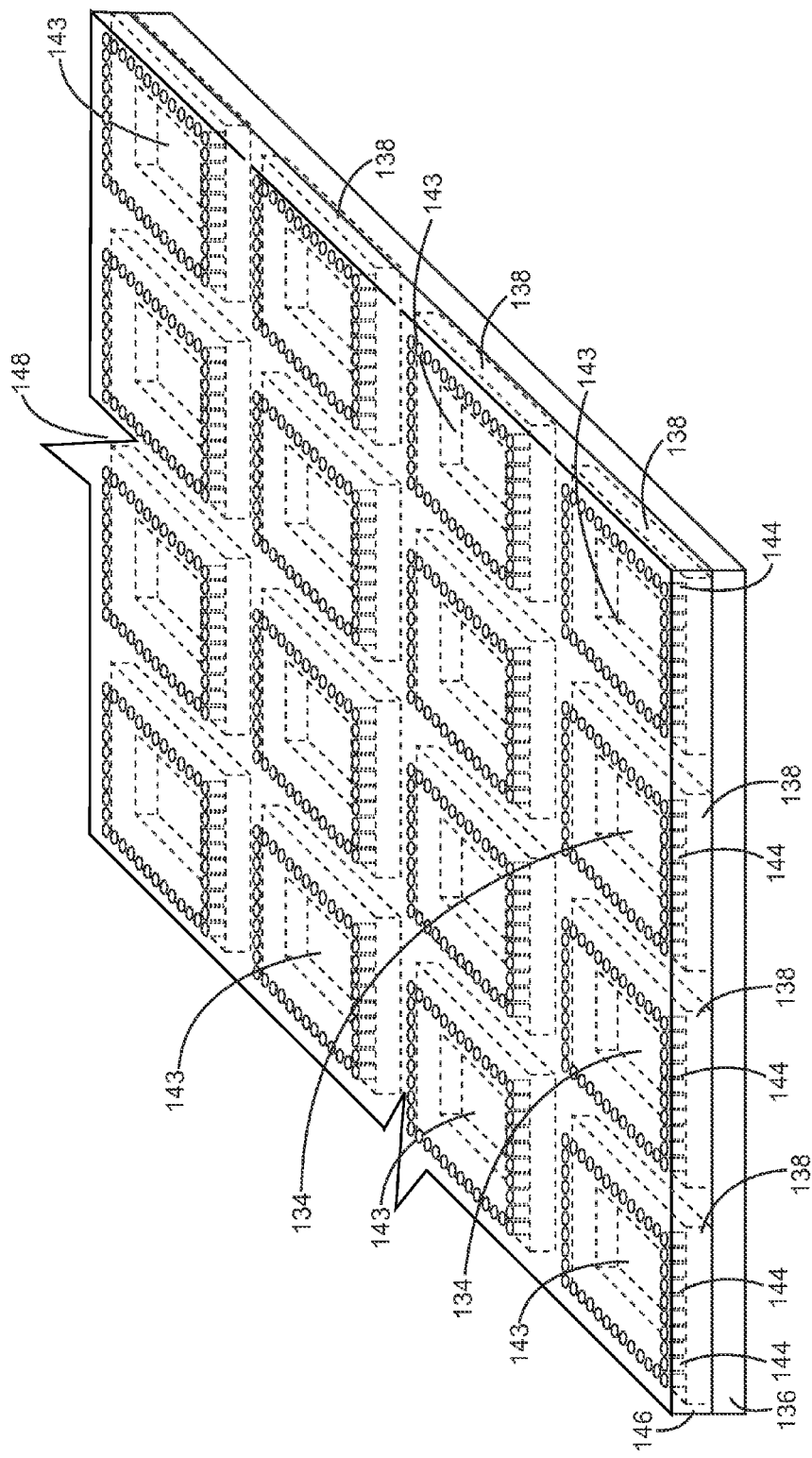
Figure 7F:
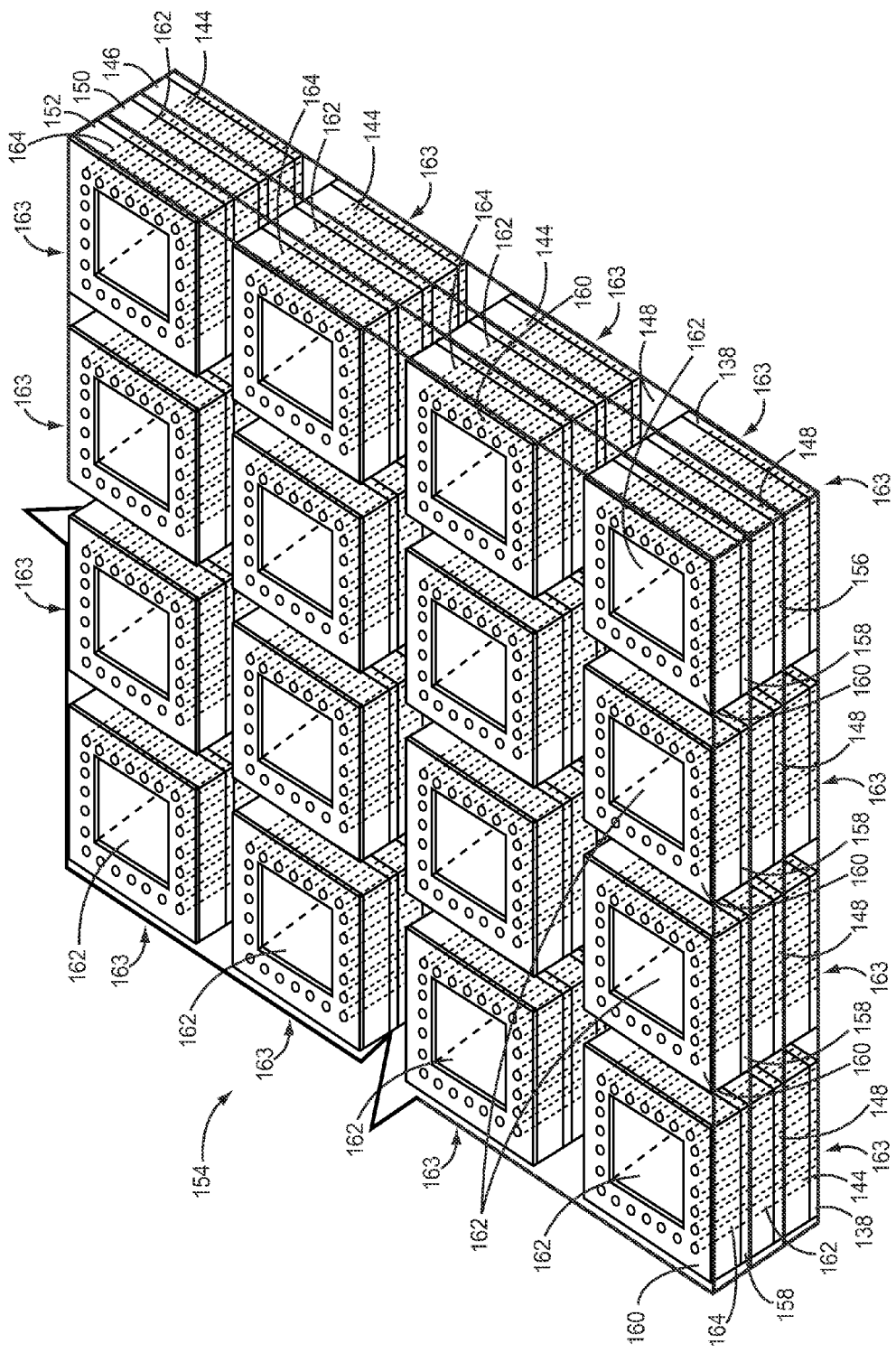

A first set of conductive vias 144 may then be formed on each of the first metallic layers 138 of the plurality of metallic structures 140 (FIG. 7D). In this embodiment, the first set of conductive vias 144 is provided around each of the first metallic layers 138. A first insulating substrate layer 146 may then be provided over the first metallic layers 138 and the first set of conductive vias 144 (FIG. 7E). For example, the first insulating substrate layer 146 may be formed from a dielectric material that is laminated over the first metallic layers 138 and the first set of conductive vias 144. When the first insulating substrate layer 146 is initially provided over the first metallic layers 138 and the first set of conductive vias 144, the first set of conductive vias 144 may extend above the first insulating substrate layer 146. In this embodiment, the first set of conductive vias 144 may be grinded so that the first set of conductive vias 144 is flush with the first insulating substrate layer 146. The first insulating substrate layer 146 forms a part of the substrate body 148 of the substrate.

The first set of conductive vias 144 of the illustrated embodiment is formed on the first metallic layers 138 prior to providing the first insulating substrate layer 146. In the alternative, the first insulating substrate layer 146 may be provided prior to forming the first set of conductive vias 144. Afterwards, holes may be etched into the first insulating substrate layer 146 and a conductive material plated into these holes to form the first set of conductive vias 144.

When the first insulating substrate layer 146 is provided, each of the apertures 142 (shown in FIG. 7C) enclosed by the first metallic layers 138 are filled with substrate material and each of the first metallic layers 138 surrounds an area 143 that forms part of a component portion of the substrate body 148. Thus, in the illustrated embodiment, the first metallic layer 138 circumscribes the area 143 (FIG. 7E) and defines a section of the periphery of the component portion. Next, the carrier metallic layer 134 may be removed and the process described in FIGS. 7A-7E may be repeated to form the desired number of insulating substrate layers 146, 150, 152 (FIG. 7F) in the substrate body 148 of the substrate 154, metallic layers 138, 156, 158, 160, and sets of conductive vias 144, 162, 164, in the metallic structures 148 for each component portion 163. The substrate 154 has a plurality of component portions 163 which each have a second, third, and fourth metallic layers 156, 158, 160 formed over the first metallic layer 138; and a first, second, and third set of conductive vias 144, 162, 164, attached between the first, second, third, and fourth metallic layers 138, 156, 158, 160. Similarly, the second and third insulating substrate layers 150, 152 are formed over the first insulating substrate layer 146. It should be noted however that the substrate 154 does not necessarily have to be formed from the bottom up. The substrate 154 could be provided from the top down where first metallic layer 138 and the first insulating substrate layer 146 are the top layers. In addition, the substrate 154 may be built from the middle outwards where the first metallic layer 138 and the first insulating substrate layer 146 are one of the middle layers of the substrate body 148. The second, third, and fourth metallic layers 156, 158, 160, the second and third insulating substrate layers 150, 152, and the second and third set of conductive vias 162, 164 would be formed on either side of the first metallic layer 138 to form the substrate 154.

Figure 7G:
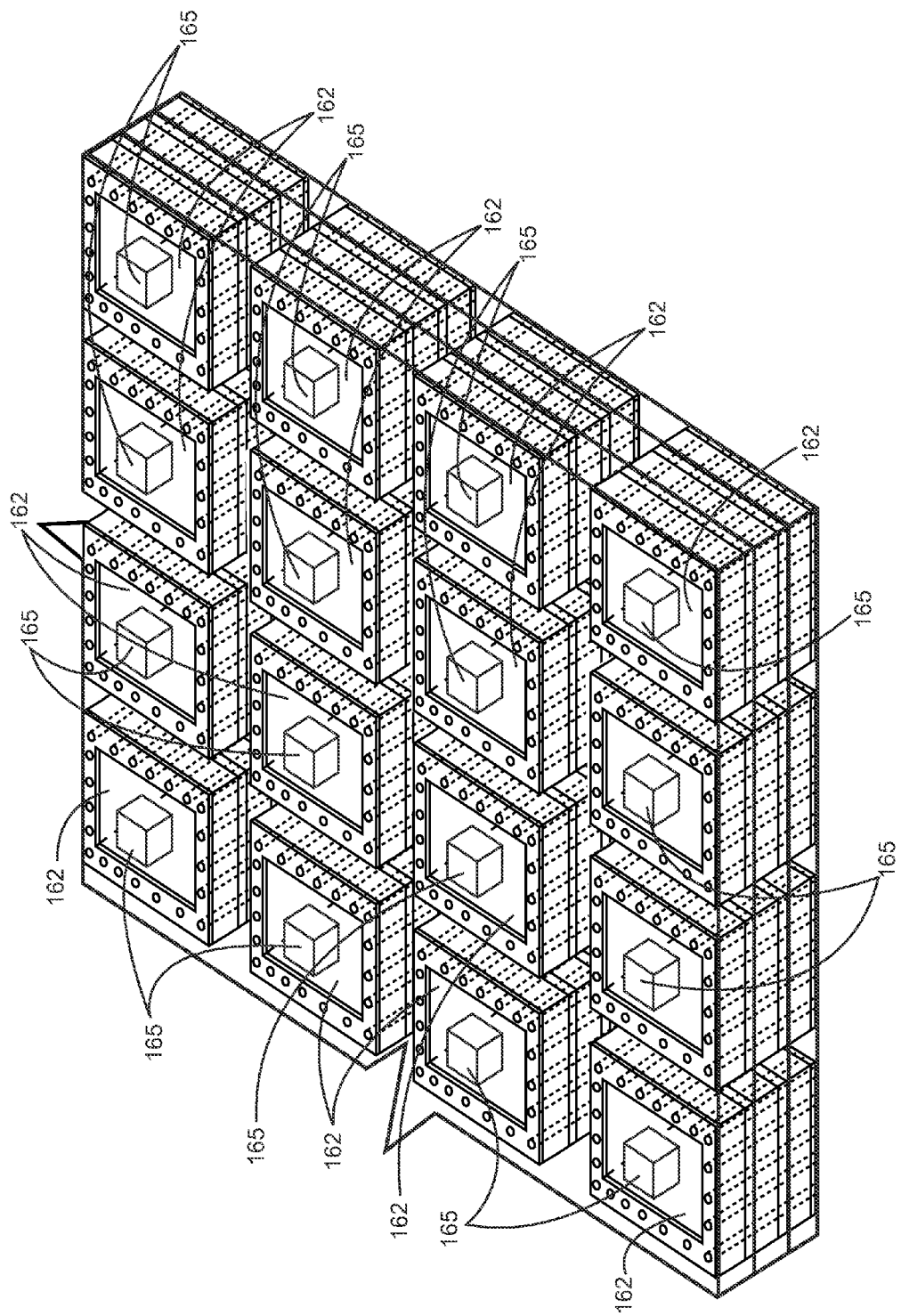
Figure 7H:
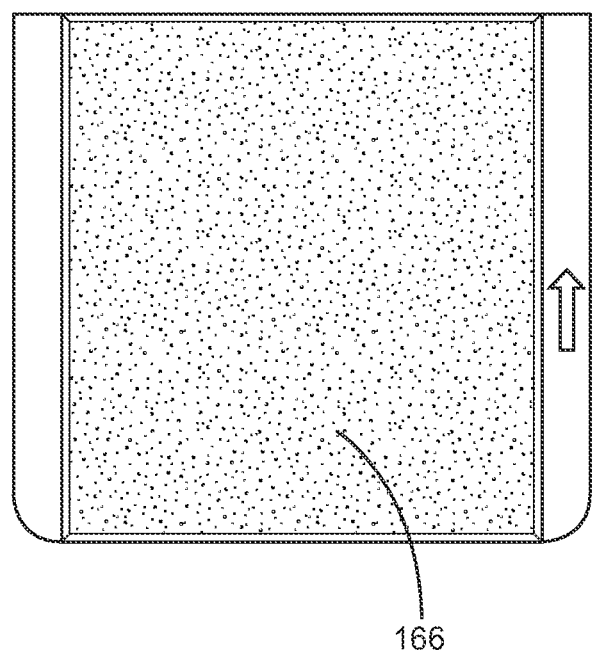
Figure 7I:
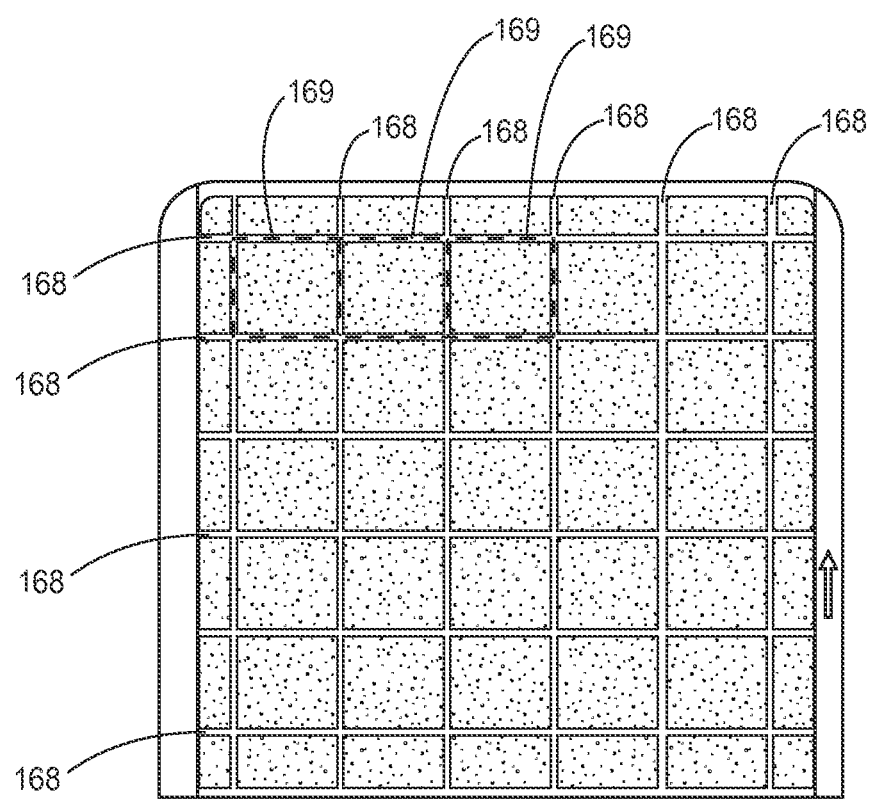

In this embodiment, as illustrated in FIG. 7G, each component portion 163 includes a component area 162 on a surface 164 of the substrate body 148. One or more electronic components 165 may be formed on each component area 162 and then an overmold 166 provided over the surface 164 to cover the component areas 162 (FIG. 7H). Channels 168 provide openings along a periphery 169 of each of the component portions 163 (FIG. 7I).

Figure 7J:
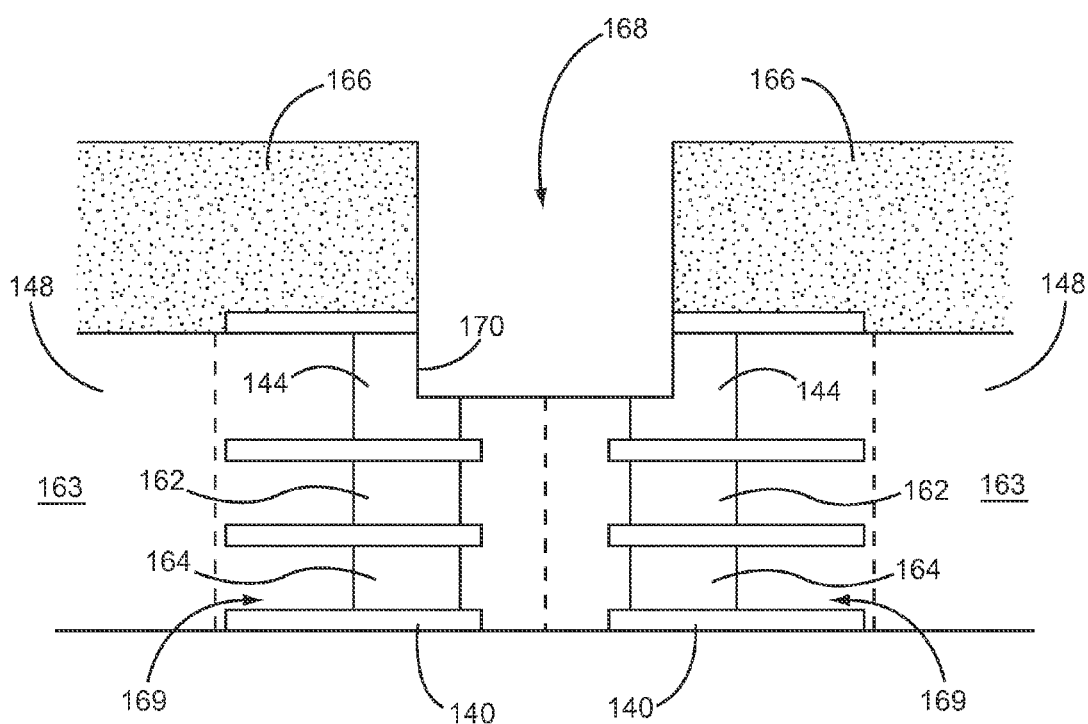
Figure 7K:
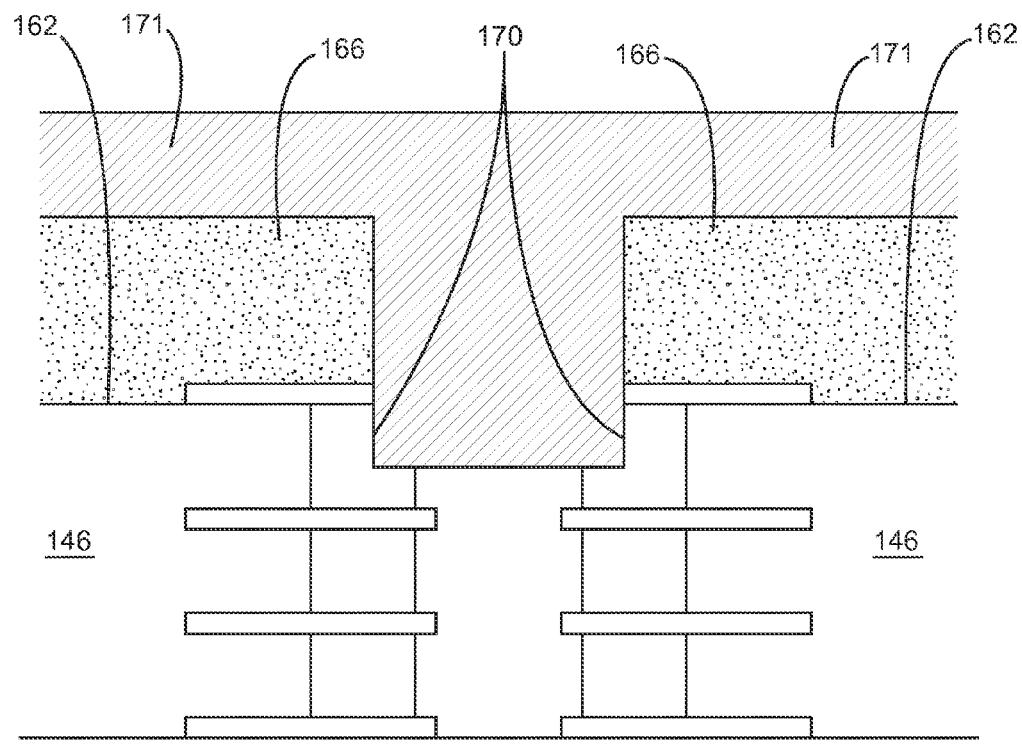
Figure 7L:
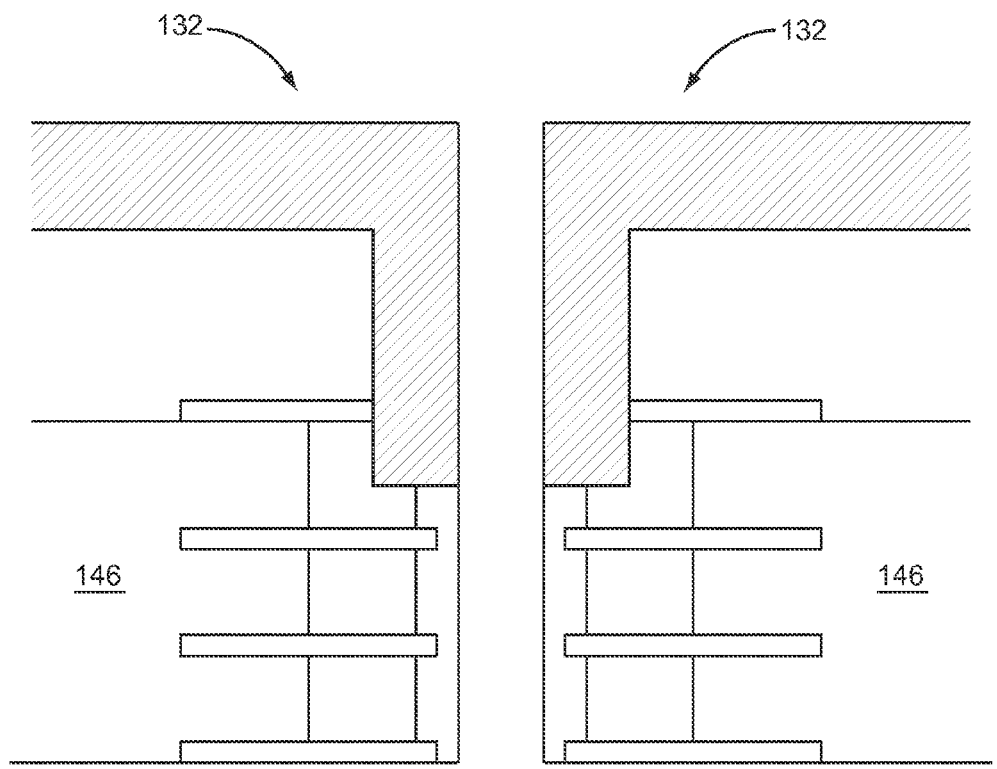

FIG. 7J illustrate a cross sectional view between two component portions 163 after the channels 168 have been formed through the overmold 166 and the fourth metallic layers 160 to expose a section 170 of the third set of conductive vias 164. However, these channels 168 may extend through the overmold 166 and the substrate body 148 to expose any desired set of conductive vias 144, 162, 164 of the metallic structures 140. In this embodiment, sections 170 of the third set of conductive vias 164 are exposed by the channel 168. An electromagnetic shield material is applied over the overmold 166 and within the channel 168 to form electromagnetic shields 171 over the component areas 162 (FIG. 7K). Sections 170 of the third set of conductive vias 164 directly attach to the electromagnetic shields 171 so that the electromagnetic shields 171 are electrically connected to the metallic structures 140. The component portions 163 may be then be singulated from one another to form individual shielded electronic modules 132 (FIG. 7L).

Figure 8A:
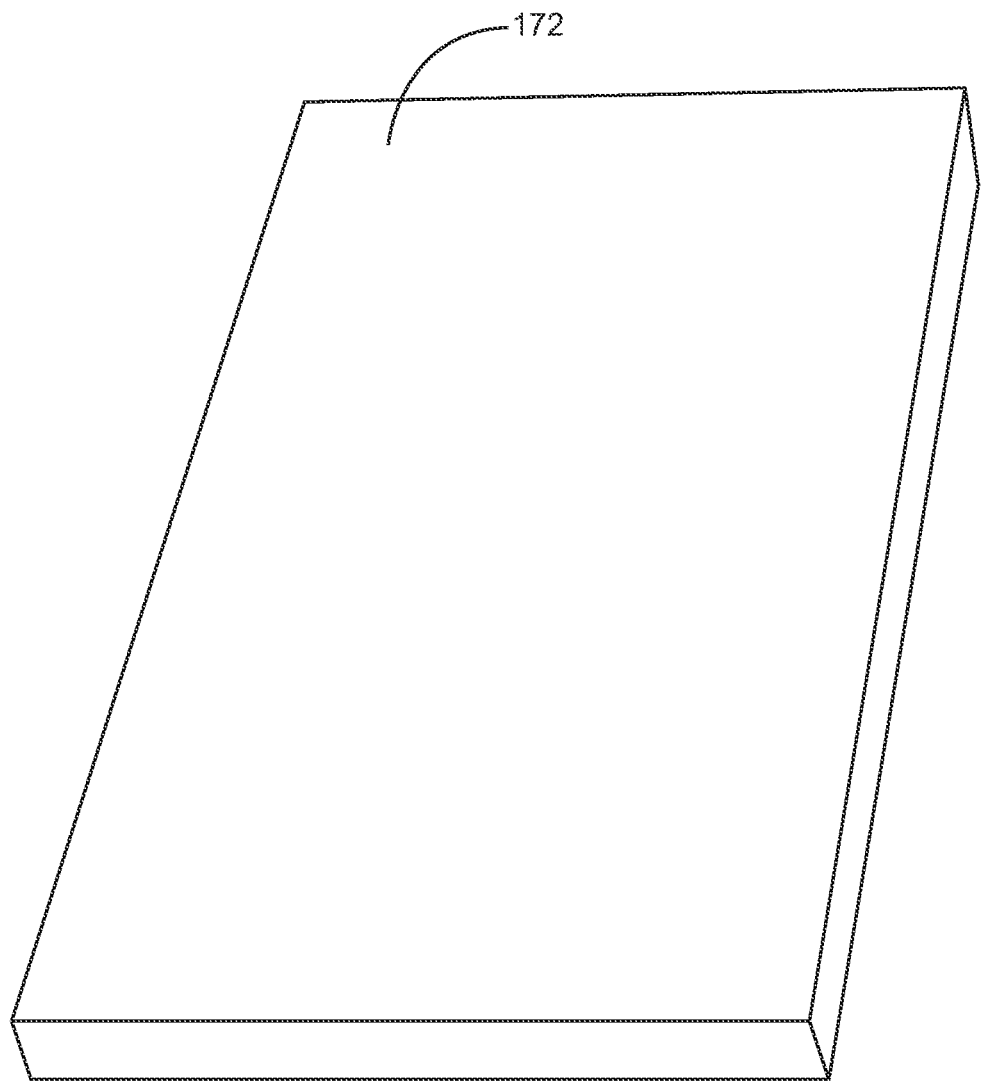
FIGS. 8A-8L illustrates steps for forming another embodiment of an electronic meta-module.
Figure 8B:
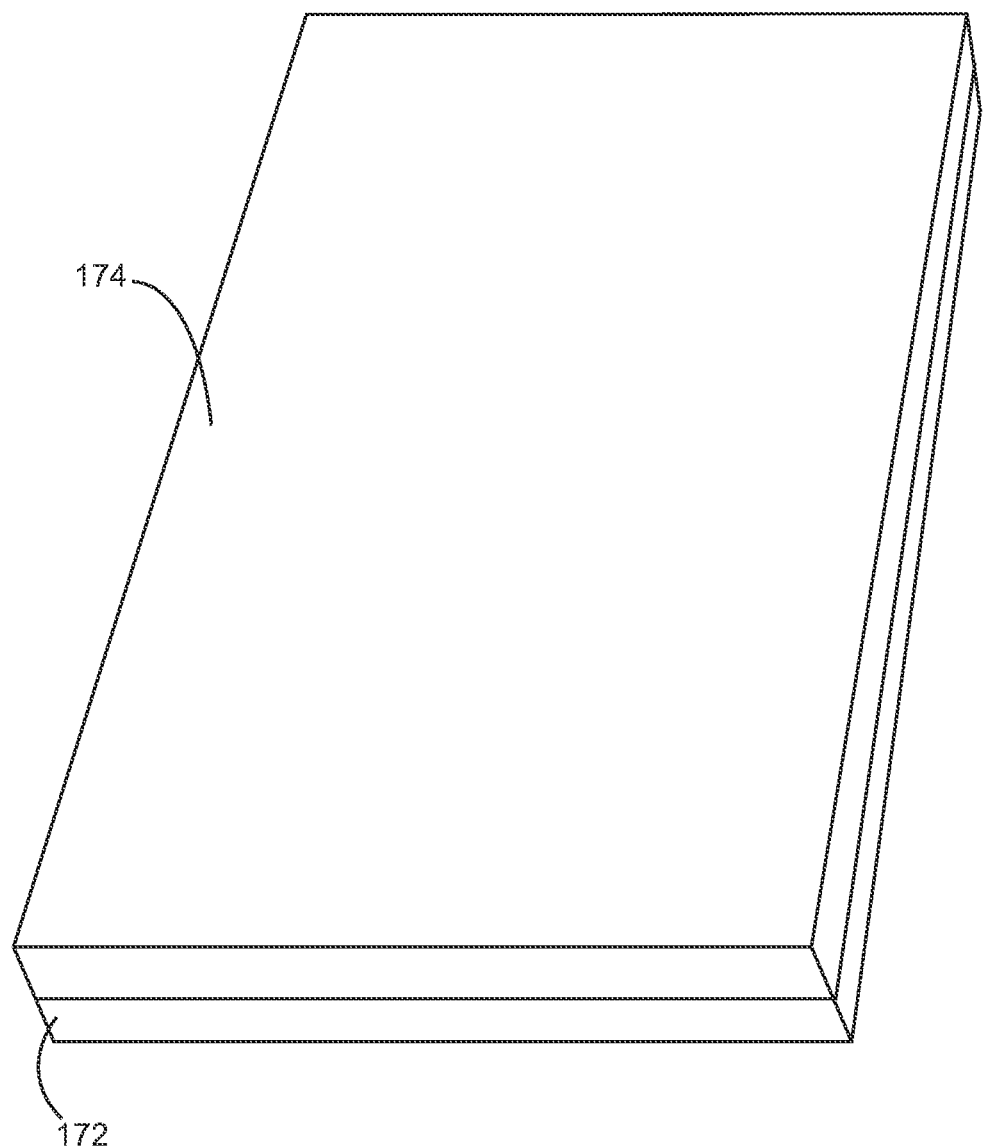
Figure 8C:
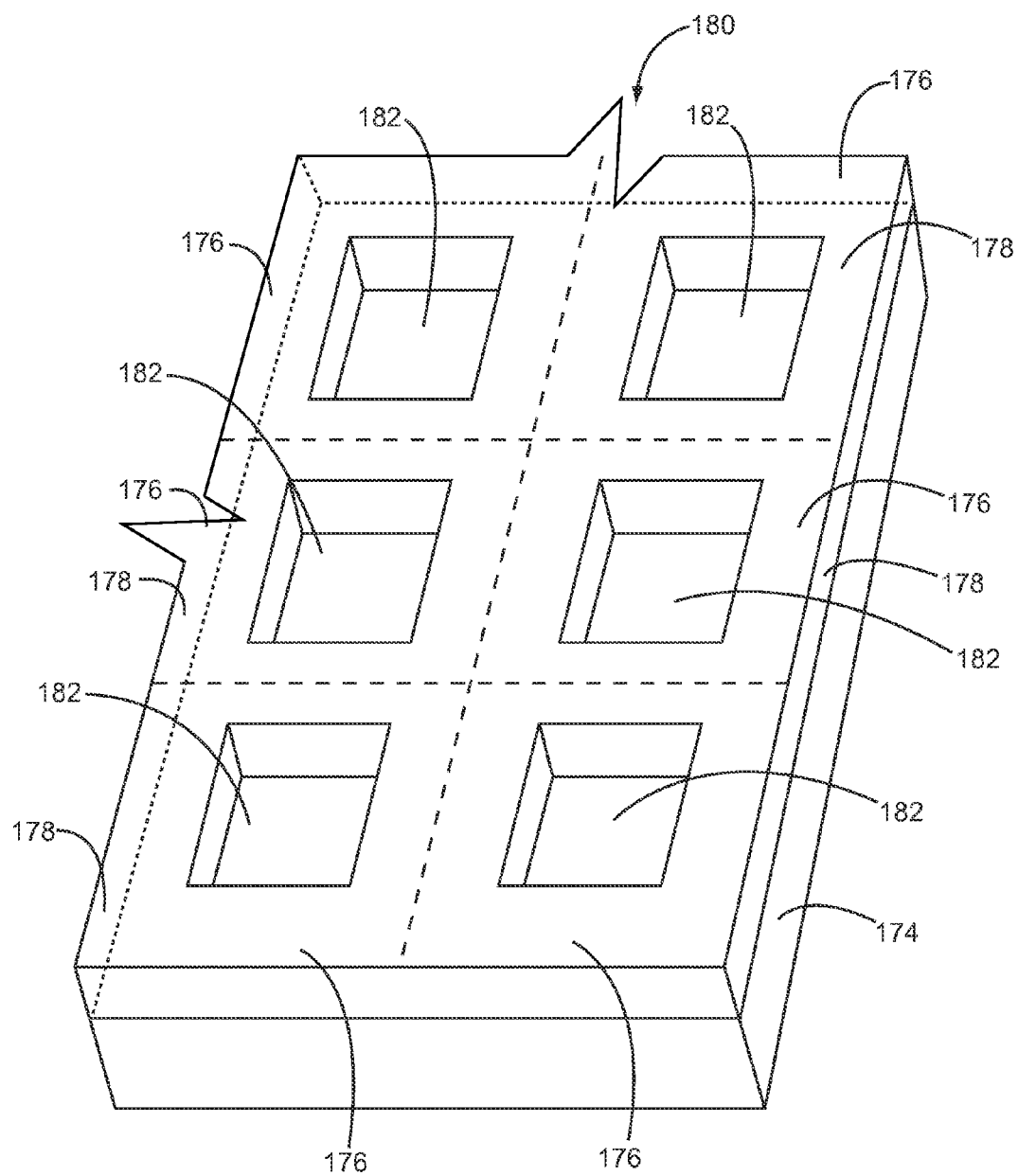

FIGS. 8A-8L illustrates a series of steps for manufacturing another embodiment of an electronic meta-module. To create the substrate for the electronic meta-module, a carrier metallic layer 172 is first provided (FIG. 8A) and a first metallic sheet 174 is formed on the carrier metallic layer 172 (FIG. 8B). Photo lithography may be utilized to form the metallic sheet 174 into a first metallic layer 176 of a plurality of metallic structures 178 (FIG. 8C). Photo lithography may also be utilized to form circuitry (not shown). This circuitry may form part of the first metallic layers 176, be within the first metallic layers 176, couple the first metallic layers 176, and/or form structures that are not part of the first metallic layers 176. The first metallic layers 176 in this embodiment are integrated with one another because the plurality of metallic structures 178 are built as part of an integrated meta-metallic structure 180. Each of these first metallic layers 176 surrounds and defines an aperture 182 which may include the circuitry discussed above (not shown). In other embodiments, the first metallic layers 176 may simply be a metallic strip and thus would not define the aperture 182.

Figure 8D:
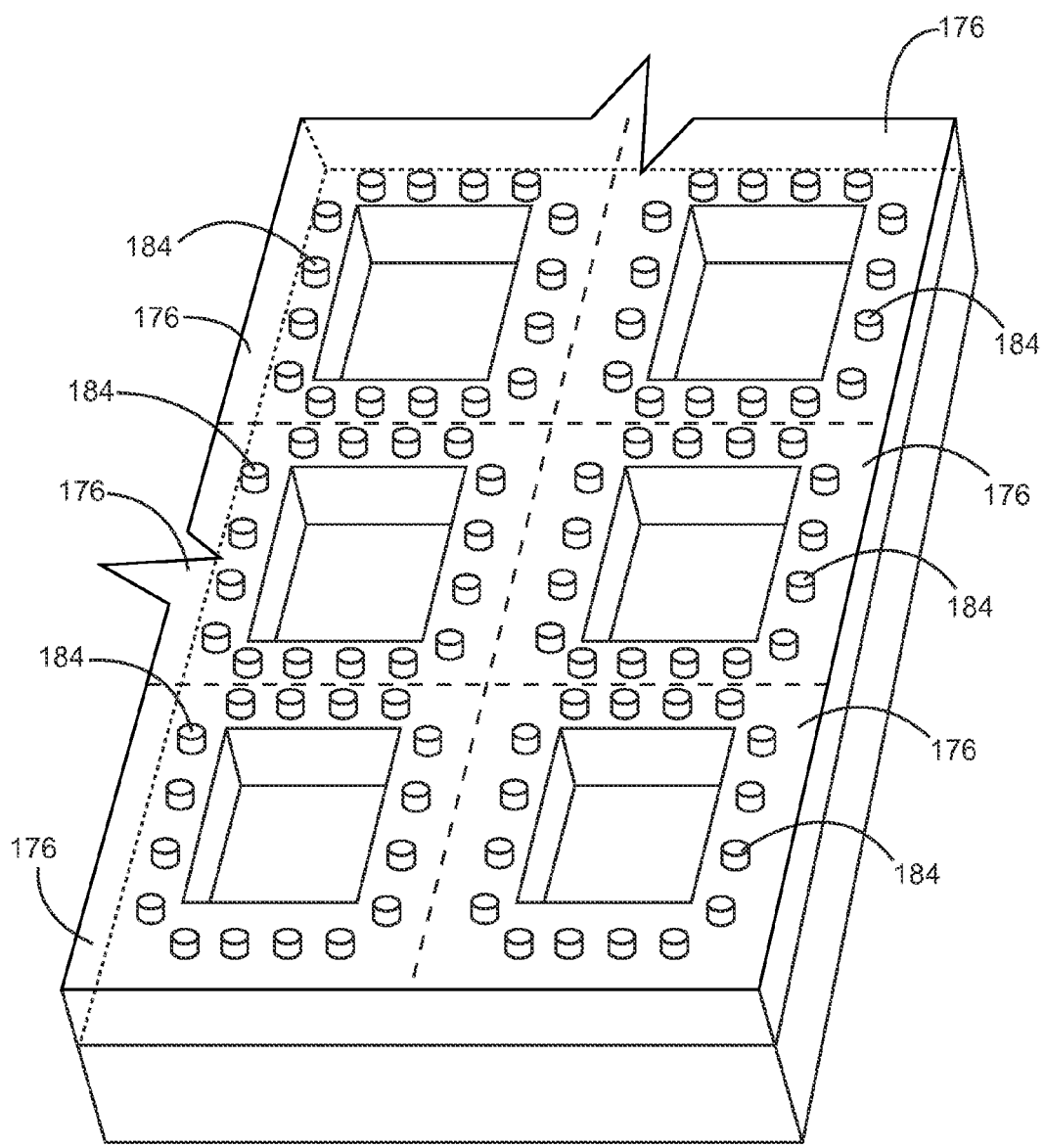
Figure 8E:
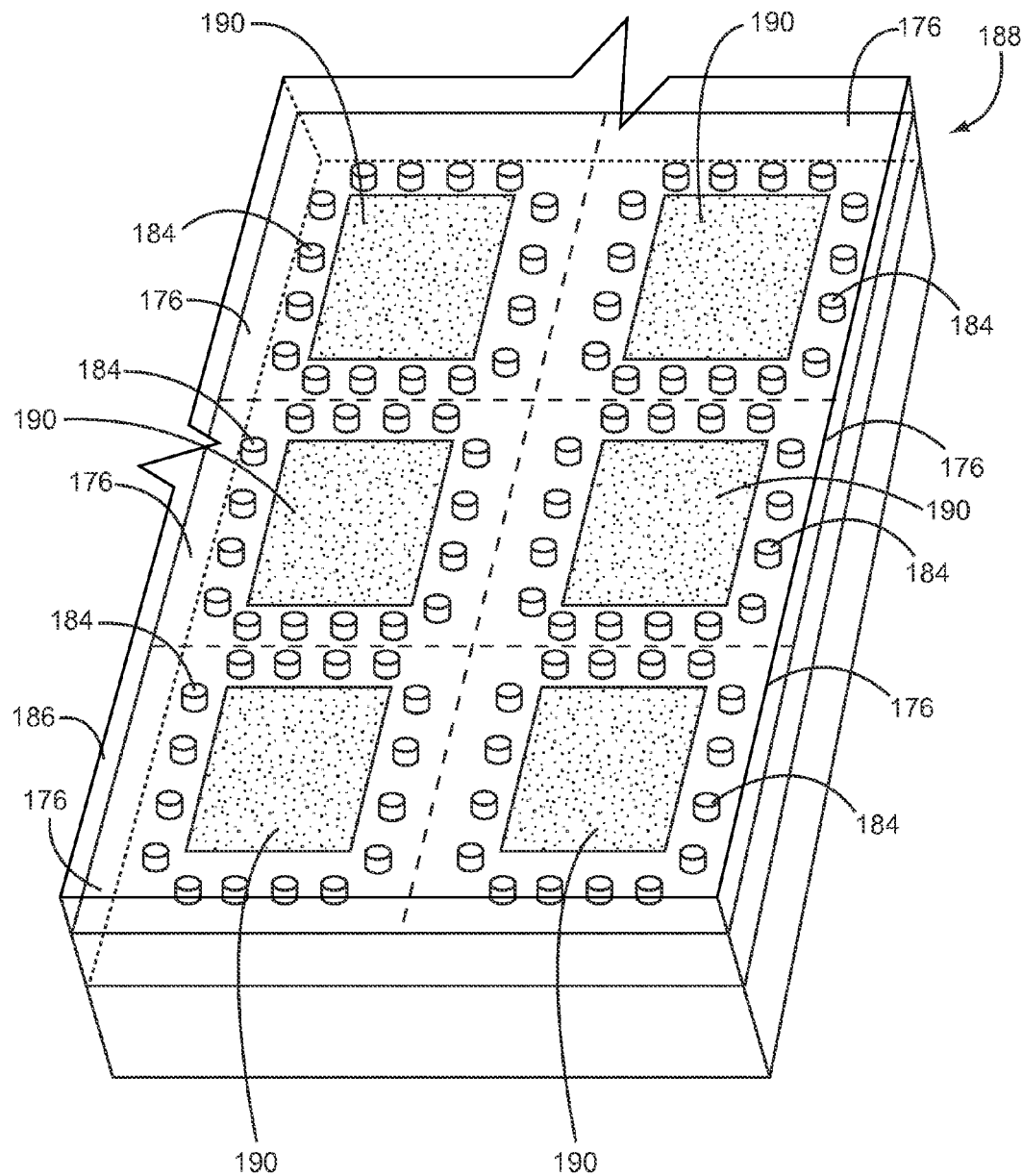

As shown in FIG. 8D, a first set of conductive vias 184 may then be formed on each of the first metallic layers 176 in the plurality of metallic structures 178. In this embodiment, the first sets of conductive vias 184 are provided around each of the first metallic layers 176. A first insulating substrate layer 186 may then be provided over the first metallic layers 176 and the first sets of conductive vias 184 (FIG. 8E). For example, the first insulating substrate layer 186 may be formed from a dielectric material that is laminated over the first metallic layers 176 and the first set of conductive vias 184. When the first insulating substrate layer 186 is initially provided over the first metallic layers 176 and the first set of conductive vias 184, the first set of conductive vias 184 may extend above the first insulating substrate layer 186. In this embodiment, the first set of conductive vias 184 may be grinded so that the first set of conductive vias 184 is flush with the first insulating substrate layer 186. The first insulating substrate layer 186 forms a part of the substrate body 188 of the substrate. The first sets of conductive vias 184 of the illustrated embodiment are formed on the first metallic layers 176 prior to providing the first insulating substrate layer 186. In the alternative, the first insulating substrate layer 186 may be provided prior to forming the first set of conductive vias 184. Afterwards, holes may be etched into the first insulating substrate layer 186 and a conductive material plated into these holes to form the first set of conductive vias 184.

Figure 8F:
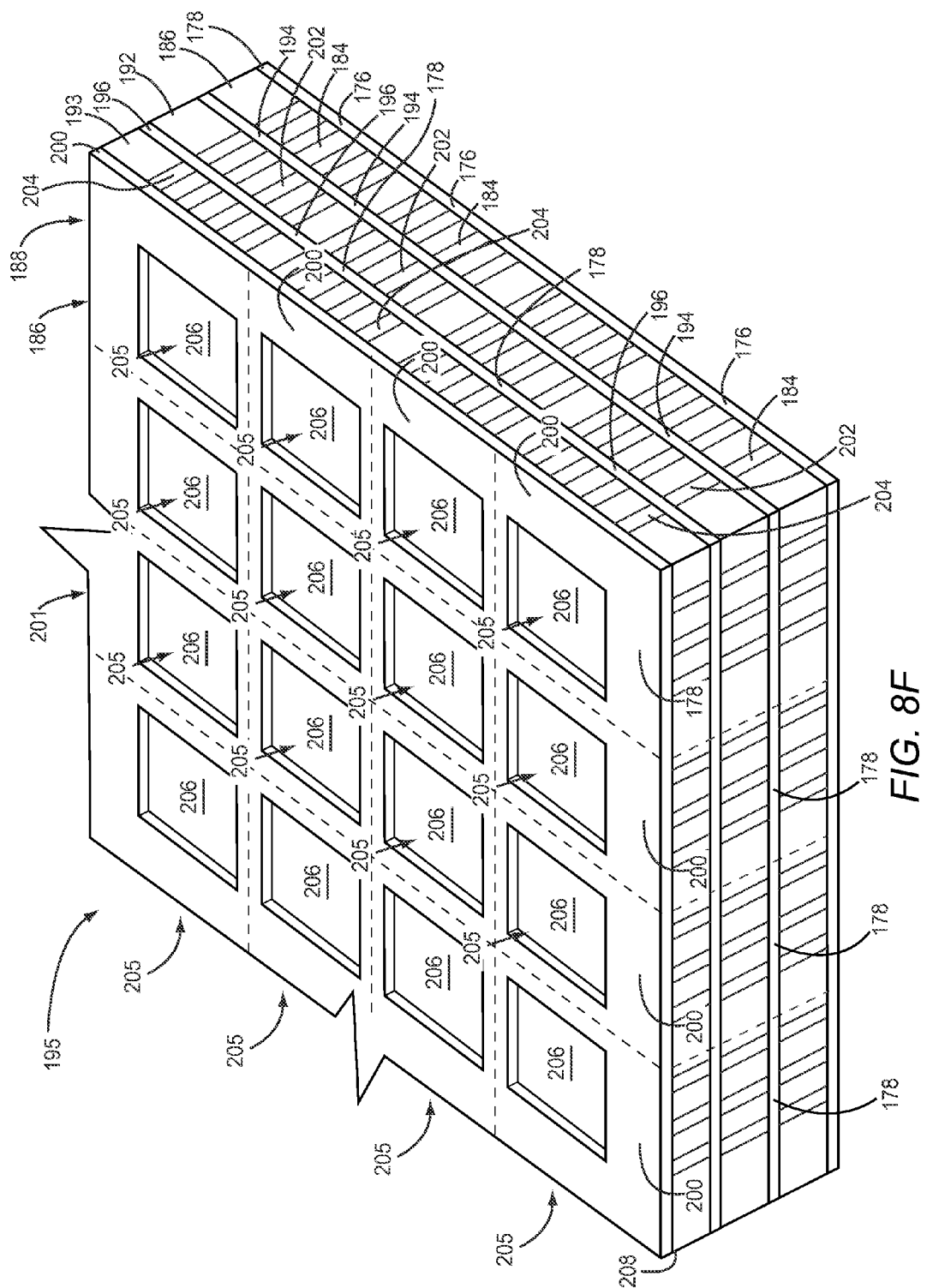
Figure 8G:
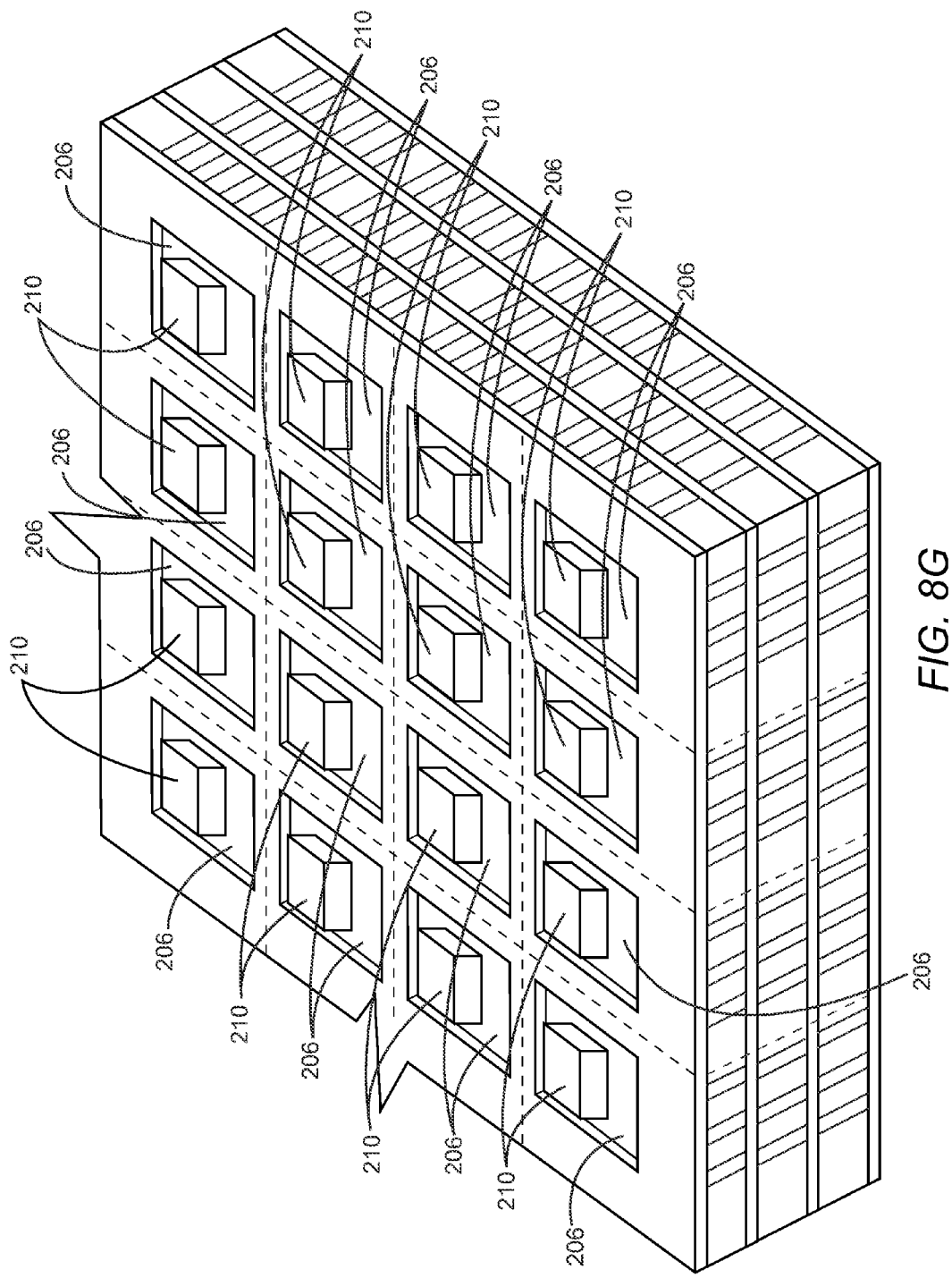

When the first insulating substrate layer 186 is provided, each of the apertures 182 (shown in FIG. 8C) enclosed by the first metallic layers 176 are filled with substrate material and each of the first metallic layers 176 surrounds an area 190 (FIG. 8E) that forms part of a component portion of the substrate body 188. Thus, in the illustrated embodiment, the first metallic layer 176 circumscribes the area 190 and defines a section of the periphery of one of the component portions. The carrier metallic layer 172 may be removed and the process described in FIGS. 8A-8E may be repeated to form the desired number of insulating substrate layers 186, 192, 193 in the substrate body 188 of the substrate 195; metallic layers 176, 194, 196, 200 in each of the metallic structures 178; and sets of conductive vias 184, 202, 204, in the metallic structures 178 (FIG. 8F). The substrate 195 is depicted as having second, third, and fourth metallic layers 194, 196, 200 formed over of the first metallic layer 176. First, second, and third sets of conductive vias 184, 202, 204, are attached between the first, second, third, and fourth metallic layers 176, 194, 196, 200. Similarly, the second and third insulating substrate layers 192, 193 are formed over the first insulating substrate layer 186. As in the previous embodiment, the substrate 195 does not necessarily have to be formed from the bottom up. The substrate 195 could be provided from the top down, where the first metallic layer 176 and the first insulating substrate layer 186 are the top layers. In addition, substrate 195 may be built from the middle outwards where the first metallic layer 176 and the first insulating substrate layer 186 are one of the middle layers of the substrate body 188. The second, third, and fourth metallic layers 194, 196, 200; the second and third insulating substrate layers 192, 193; and the second and third set of conductive vias 202, 204 would be formed on either side of the first metallic layer 176 and first insulating substrate layer 186 to form the substrate 195.

Figure 8H:
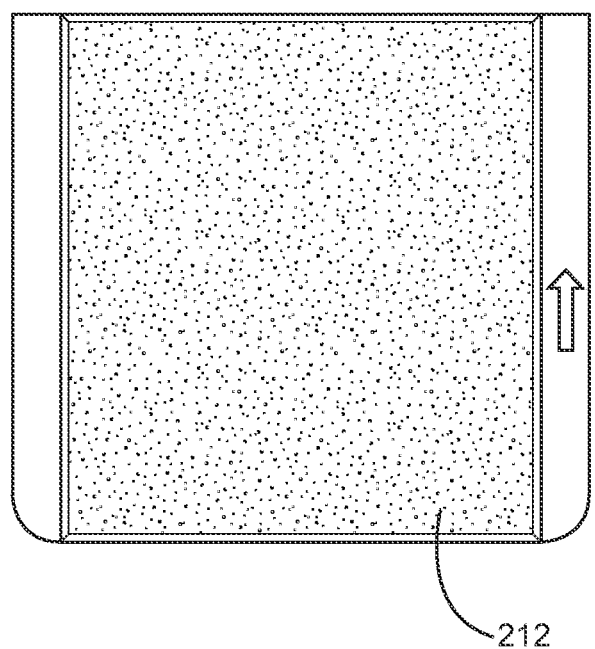
Figure 8I:
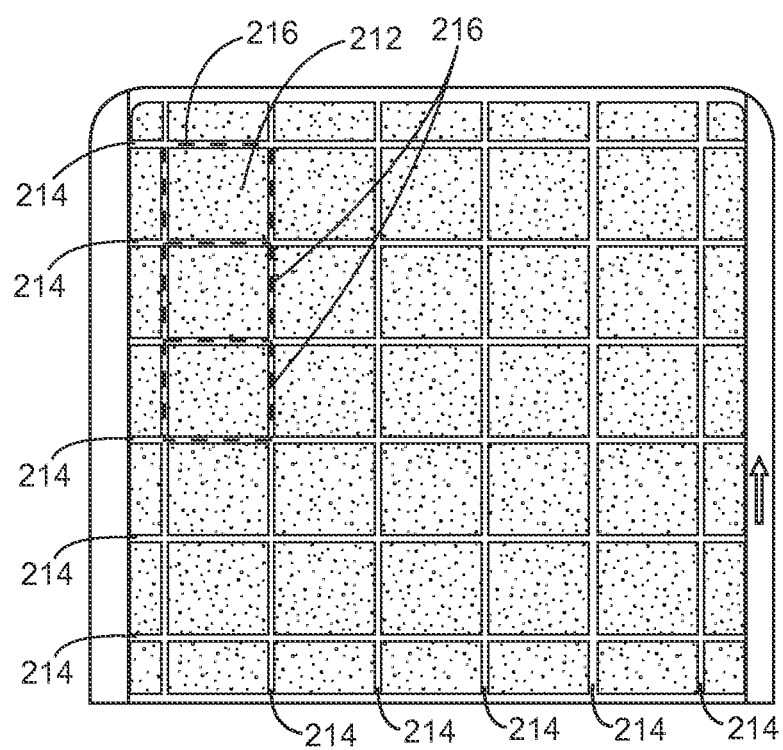

The substrate 195 has a plurality of component portions 205 (FIG. 8F) each having a metallic structure 178 within the substrate body 188. In this embodiment, each component portion 205 is also formed to have a component area 206 on a surface 208 of the substrate body 188. Next, one or more electronic components 210 may be attached to each component area 206 (FIG. 8G) and then an overmold 212 provided over the surface 208 to cover the component areas 206 (FIG. 8H). Cuts are made into the overmold 212 and channels 214 form openings through the overmold 212 and substrate body 188 along a periphery 216 of each of the component portions 205 (FIG. 8I).

Figure 8J:
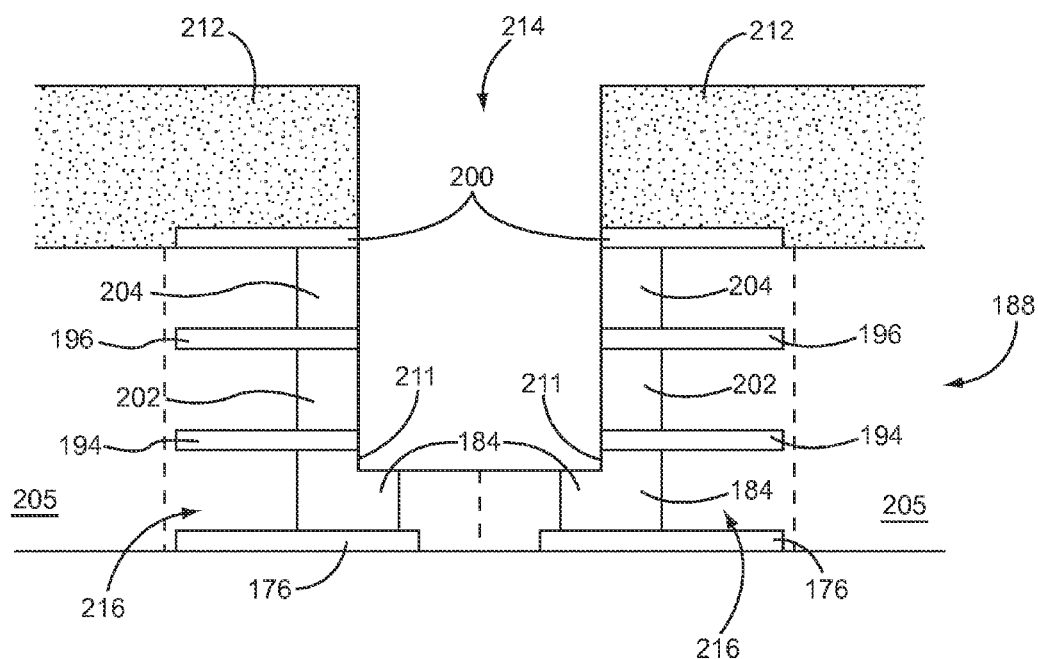
Figure 8K:
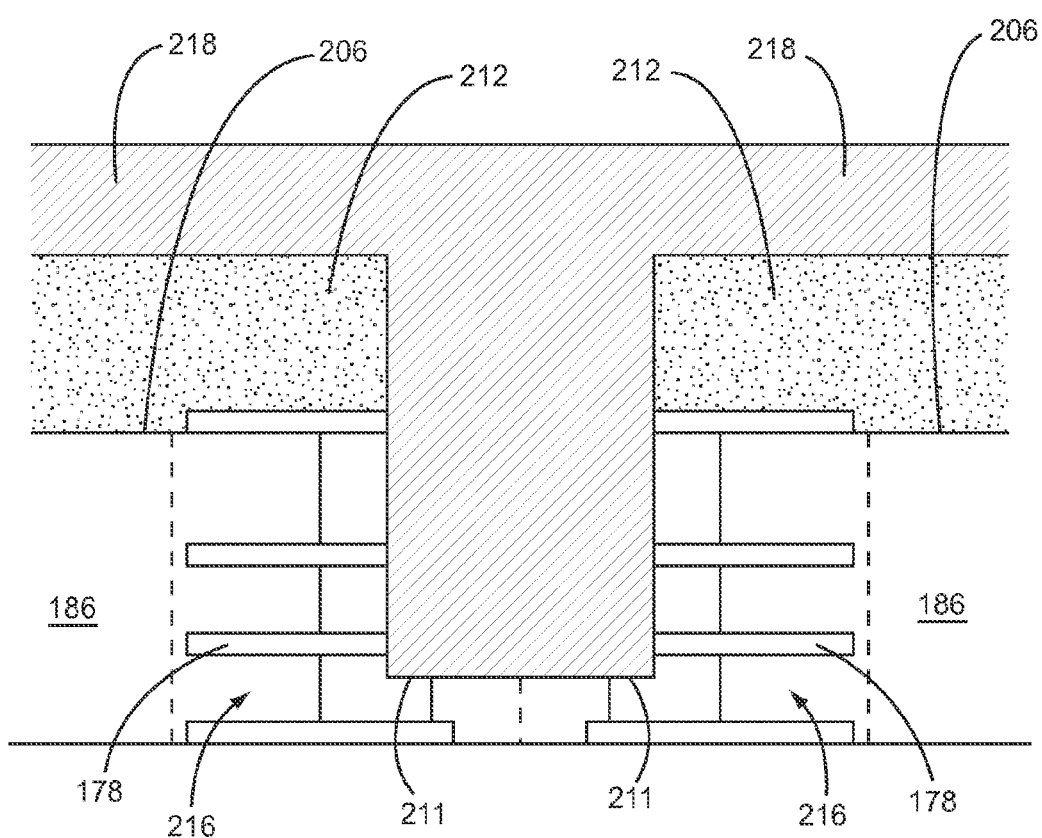
Figure 8L:
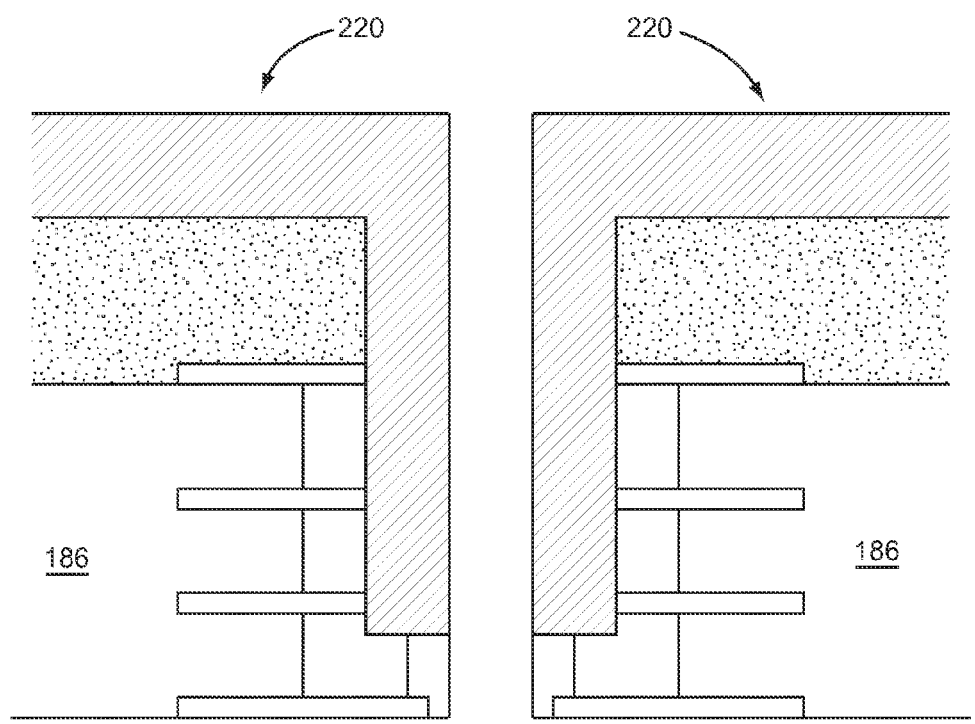

FIG. 8J illustrates a cross sectional view between two component portions 205 after the channels 214 have been formed through the overmold 212; the second, third, fourth metallic layers 194, 196, 200; and the first, second, third set of conductive vias 184, 202, 204 to expose a section 211 of the first set of conductive vias 184. However, these channels 214 may extend through the overmold 206 and the substrate body 188 to expose any desired set of conductive vias 184, 202, 204 of the metallic structures 178. In this embodiment, sections 211 of the third set of conductive vias 204 are exposed by the channel 214. An electromagnetic shield material is applied over the overmold 212 and within the channel 214 to form electromagnetic shields 218 over the component areas 206 (FIG. 8K). The sections 211 of the first set of conductive vias 184 (and other exposed sections of the metallic structures 178) are directly attached to one of the electromagnetic shields 218 so that the electromagnetic shields 218 are electrically connected to the metallic structures 178. The component portions 205 may then be singulated from one another to form individual shielded electronic modules 220 (FIG. 8L).

Those skilled in the art will recognize improvements and modifications to the embodiments of the present disclosure. All such improvements and modifications are considered within the scope of the concepts disclosed herein and the claims that follow.

What is claimed is:

1. A method of manufacturing an electronic module, comprising:
    providing a substrate comprising a component portion wherein the component portion includes a component area on a surface of the substrate, a first metallic layer that extends continuously along a periphery of the component portion, a first conductive vertical interconnect access structure (via) attached to the first metallic layer at the periphery of the component portion, wherein the via extends through the substrate;
    providing an electronic component on the component area;
    providing an overmold over the surface to cover the component area;
    forming an opening through at least the overmold that exposes at least a section of the first conductive via; and
    applying an electromagnetic shield material over the overmold and within the opening to form an electromagnetic shield over the component area such that the electromagnetic shield is directly attached to at least the section of the first conductive via.

2. The method of claim 1, wherein the first conductive via comprises a conductive bar.

3. The method of claim 1 wherein providing the substrate further comprises forming the first conductive via over the first metallic layer.

4. The method of claim 3, wherein providing the substrate further comprises providing the first conductive via over the first metallic layer such that the first conductive via extends above the surface of the substrate.

5. The method of claim 1, wherein providing the substrate further comprises:
    providing the first conductive via within the substrate; and
    providing the first metallic layer over the first conductive via and within the substrate.

6. The method of claim 1 wherein forming an opening through at least the overmold that exposes at least the section of the first conductive via includes cutting into the first conductive via.

7. The method of claim 1, further comprising coupling the first conductive via to ground.

8. The method of claim 1, wherein providing the substrate further comprises providing a second metallic layer within the substrate that extends along the periphery of the component portion and is attached to the first conductive via, the second metallic layer being positioned below the first metallic layer such that the first conductive via is positioned between the first and second metallic layers.

9. The method of claim 8, wherein providing the substrate further comprises providing the first and second metallic layers so that the first and second metallic layers substantially surround the periphery of the component portion.

10. The method of claim 9, further comprises:
    wherein providing the substrate further comprises providing a first plurality of conductive vias so that the first plurality of conductive vias substantially surround the periphery of the component portion and are attached between the first and second metallic layers, the first plurality of conductive vias including the first conductive via;
    wherein forming the opening through at least the overmold comprises exposing at least a section of each of the first plurality of conductive vias which includes at least the section of the first conductive via; and
    wherein applying the electromagnetic shield material over the overmold and within the opening comprises forming the electromagnetic shield so that the electromagnetic shield is directly attached to at least the section of each of the first plurality of conductive vias.

11. The method of claim 10, wherein providing the substrate further comprises:
    providing a third metallic layer within the substrate below the second metallic layer; and
    providing a second plurality of conductive vias that are each attached to the second metallic layer and the third metallic layer, the second plurality of conductive vias substantially surrounding the periphery of the component portion.

12. A method of manufacturing an electronic module, comprising:
    providing a substrate comprising a component portion wherein the component portion includes a component area on a surface of the substrate, a first metallic layer that extends along a periphery of the component portion, a first conductive vertical interconnect access structure (via) attached to the first metallic layer at the periphery of the component portion, wherein the via extends through the substrate;
    providing an electronic component on the component area;
    providing an overmold over the surface to cover the component area;
    forming an opening through at least the overmold that exposes at least a section of the first conductive via; and
    applying an electromagnetic shield material over the overmold and within the opening to form an electromagnetic shield over the component area such that the electromagnetic shield is directly attached to at least the section of the first conductive via, and
    wherein the forming an opening through at least the overmold that exposes at least the section of the first conductive via includes cutting into the first conductive via.

\* \* \* \* \*